US012731623B2

(12) United States Patent
Johnson et al.

(10) Patent No.: US 12,731,623 B2
(45) Date of Patent: Sep. 8, 2026

(54) DATA PATH SIGNAL AMPLIFICATION IN COUPLED SEMICONDUCTOR SYSTEMS

(71) Applicant: Micron Technology, Inc., Boise, ID (US)

(72) Inventors: James Brian Johnson, Boise, ID (US); Brent Keeth, Boise, ID (US); Kunal R. Parekh, Boise, ID (US); Eiichi Nakano, Boise, ID (US); Amy Rae Griffin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 18/607,033

(22) Filed: Mar. 15, 2024

(65) Prior Publication Data

US 2024/0355371 A1 Oct. 24, 2024

Related U.S. Application Data

(60) Provisional application No. 63/461,086, filed on Apr. 21, 2023.

(51) Int. Cl.

*G11C 7/10* (2006.01)
*G11C 7/22* (2006.01)
*G11C 29/52* (2006.01)

(52) U.S. Cl.

CPC ............ *G11C 7/1069* (2013.01); *G11C 7/222* (2013.01); *G11C 29/52* (2013.01)

(58) Field of Classification Search

CPC ....... G11C 7/1069; G11C 7/222; G11C 29/52; G11C 5/025; G11C 7/065
USPC .................................................. 365/189.011
See application file for complete search history.

(56) References Cited

U.S. PATENT DOCUMENTS 8,947,929 B1 * 2/2015 Yang .................. G11C 11/4096 365/189.17
2018/0336092 A1 * 11/2018 Kim .................... G06F 11/1048

* cited by examiner

*Primary Examiner* — Huan Hoang
(74) *Attorney, Agent, or Firm* — Holland & Hart LLP

(57) ABSTRACT

Methods, systems, and devices for data path signal amplification in coupled semiconductor systems are described. A semiconductor system may implement a first die including memory arrays and a second die including a host interface. The first die may include a first portion of a data path between the memory arrays and the host interface, including a first portion of data path signal amplification circuitry. The second die may include a second portion of the data path, including a second portion of data path signal amplification circuitry. The semiconductor system may implement fine-pitch interconnection between dies to support a relatively greater quantity of signal paths of the data path which, in some examples, may support reducing or eliminating serialization/deserialization circuitry associated with coarser interconnection. In some implementations, a semiconductor system may implement a switching component operable to switch between data paths having different amplification configurations of the dies.

20 Claims, 11 Drawing Sheets

700

900

Figure 10:
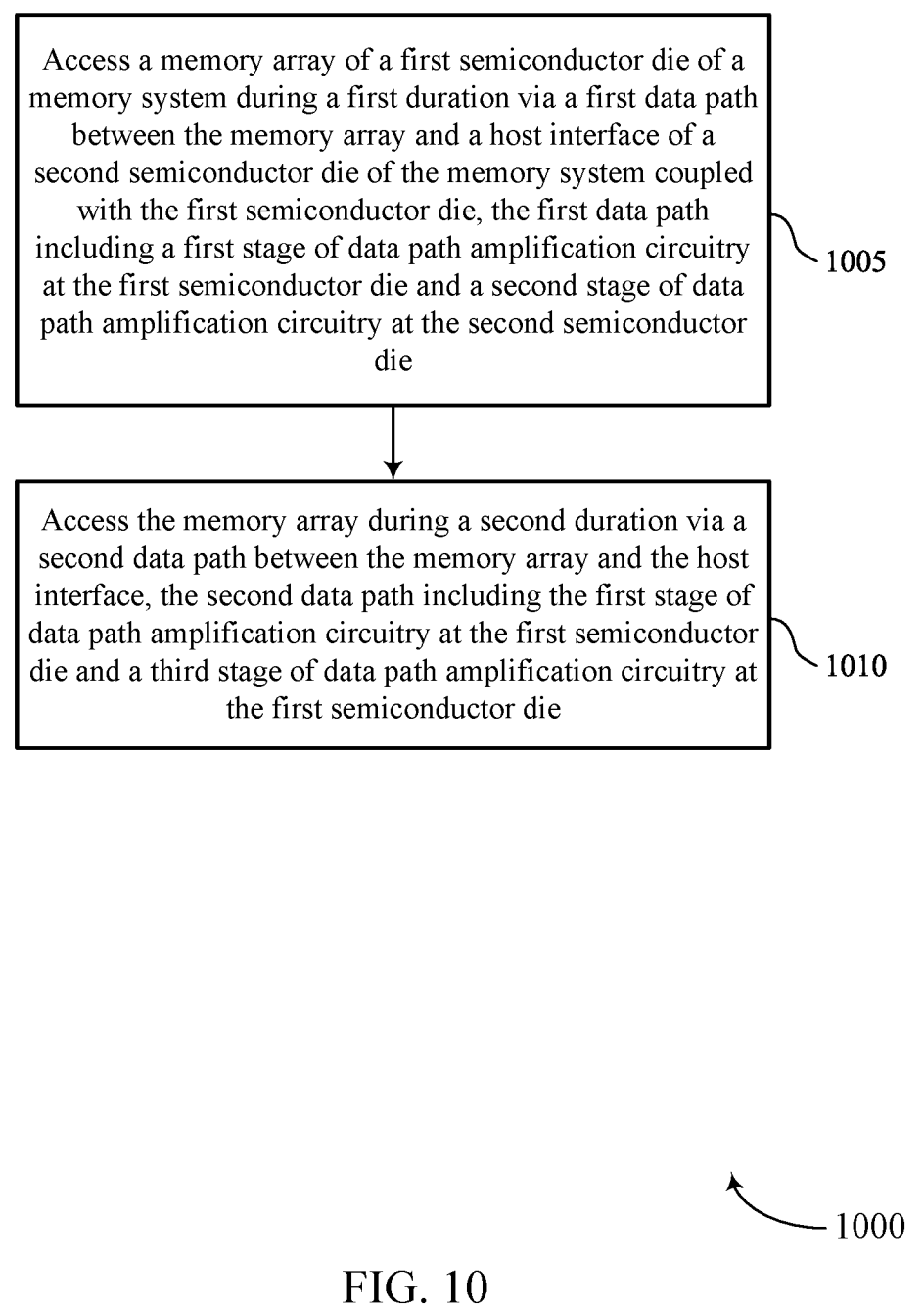

Access a memory array of a first semiconductor die of a memory system during a first duration via a first data path between the memory array and a host interface of a second semiconductor die of the memory system coupled with the first semiconductor die, the first data path including a first stage of data path amplification circuitry at the first semiconductor die and a second stage of data path amplification circuitry at the second semiconductor die

1005

Access the memory array during a second duration via a second data path between the memory array and the host interface, the second data path including the first stage of data path amplification circuitry at the first semiconductor die and a third stage of data path amplification circuitry at the first semiconductor die

Figure 11:
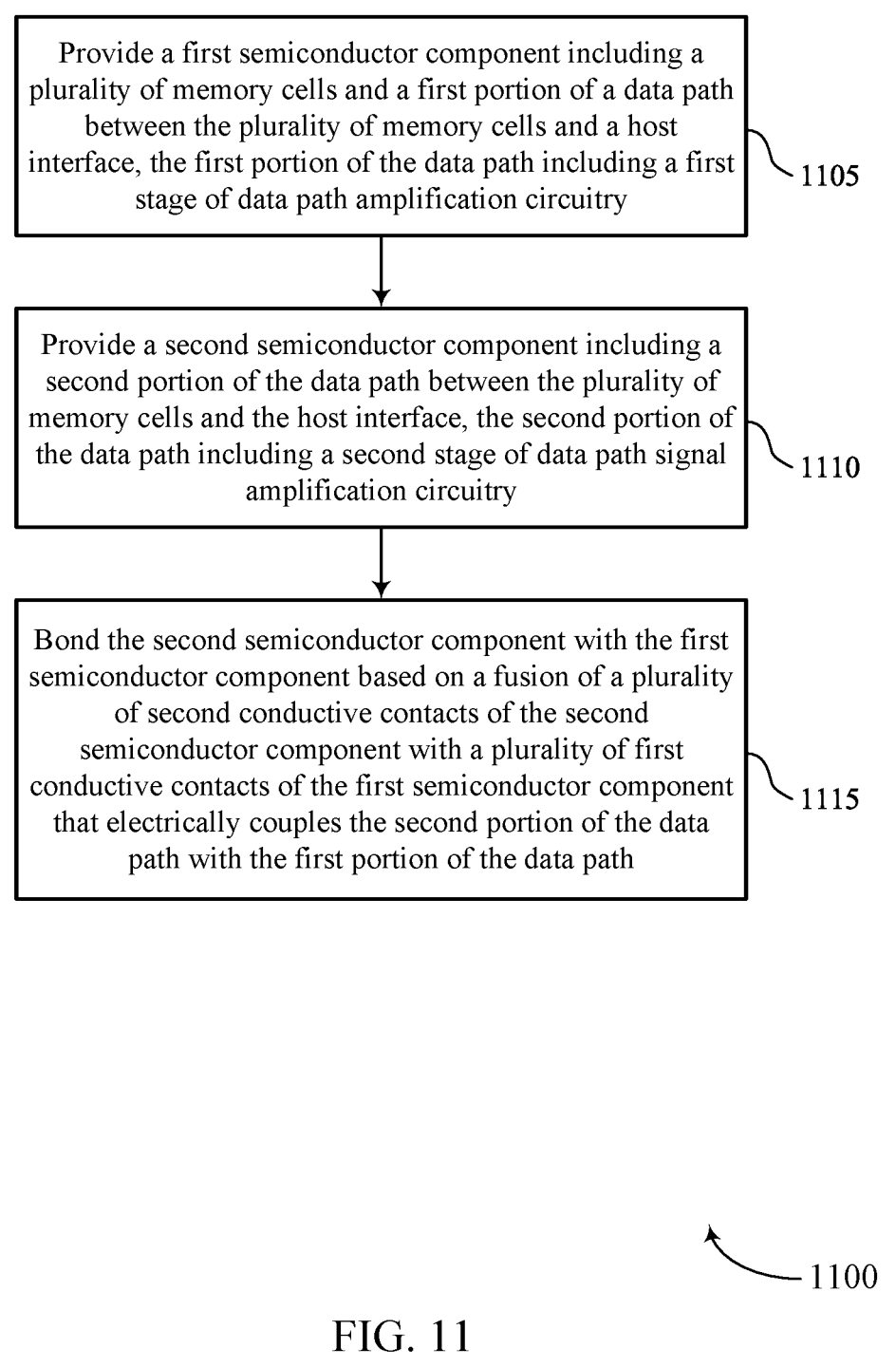

Provide a first semiconductor component including a plurality of memory cells and a first portion of a data path between the plurality of memory cells and a host interface, the first portion of the data path including a first stage of data path amplification circuitry

1105

Provide a second semiconductor component including a second portion of the data path between the plurality of memory cells and the host interface, the second portion of the data path including a second stage of data path signal amplification circuitry

1110

Bond the second semiconductor component with the first semiconductor component based on a fusion of a plurality of second conductive contacts of the second semiconductor component with a plurality of first conductive contacts of the first semiconductor component that electrically couples the second portion of the data path with the first portion of the data path

DATA PATH SIGNAL AMPLIFICATION IN COUPLED SEMICONDUCTOR SYSTEMS

CROSS REFERENCE

The present application for patent claims the benefit of U.S. Provisional Patent Application No. 63/461,086 by JOHNSON et al., entitled "DATA PATH SIGNAL AMPLIFICATION IN COUPLED SEMICONDUCTOR SYSTEMS," filed Apr. 21, 2023, assigned to the assignee hereof, and expressly incorporated by reference in its entirety herein.

TECHNICAL FIELD

The following relates to one or more systems for memory, including data path signal amplification in coupled semiconductor systems.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 10 and 11 illustrate flowcharts showing methods that support data path signal amplification in coupled semiconductor systems in accordance with examples as disclosed herein.

DETAILED DESCRIPTION

Figure 1:
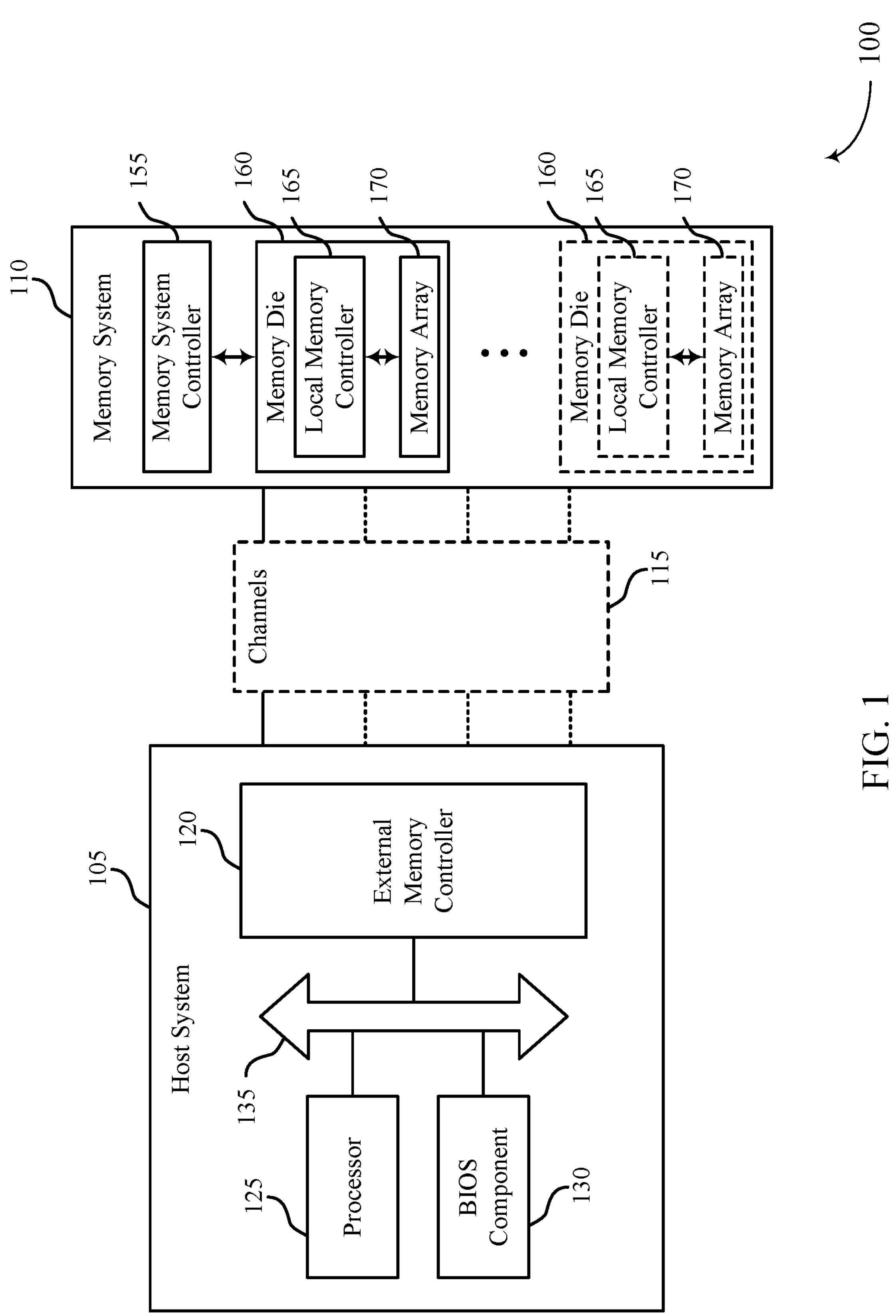
FIG. 1 illustrates an example of a system that supports data path signal amplification in coupled semiconductor systems in accordance with examples as disclosed herein.

In some semiconductor systems (e.g., memory systems), a semiconductor die (e.g., a memory die) may include one or more memory arrays (e.g., one or more arrays of memory cells) and at least a portion of circuitry configured for accessing the one or more memory arrays (e.g., in response to an access command). Such a semiconductor die may include contacts that support a communicative coupling between the circuitry of the semiconductor die and one or more other semiconductor dies (e.g., a logic die, which may include a host interface used to communicate commands or data associated with accessing the one or more memory arrays) or other base. However, some interconnection techniques for semiconductor dies may have limitations associated with a quantity of contacts supported for a given die size, or a throughput of information between the semiconductor dies (e.g., data rate limitations), or an amount of storage for a given semiconductor die size (e.g., storage density limitations), among other limitations.

In some examples, techniques for interconnection between semiconductor dies may be associated with a contact density limitation (e.g., a quantity of contacts in a given area of interconnection). To support a data rate along a data path between a memory array on a memory die and a host interface on a logic die, the memory die may include serialization/deserialization (SERDES) circuitry that converts signaling between relatively slower signaling using relatively more signal paths and relatively faster signaling using relatively fewer signal paths (e.g., to support the data rate with fewer contacts between the memory die and the logic die). However, SERDES circuitry, among other data path circuitry, may involve multiple stages of signal amplification to maintain signal integrity along the data path, which may occupy an area of a memory die, or may be associated with a power consumption at the memory die, among other characteristics.

In accordance with examples as disclosed herein, a semiconductor system may implement a first semiconductor die (e.g., a memory die) including one or more memory arrays and a second semiconductor die (e.g., a logic die) including a host interface. The first semiconductor die may include a first portion of a data path between the memory arrays and the host interface, including a first portion of signal amplification circuitry (e.g., sense amplifiers configured to be coupled with memory cells of the arrays) of the data path. The second semiconductor die may include a second portion of the data path, including a second portion of signal amplification circuitry (e.g., data sense amplifiers, helper flip-flops) of the data path. The semiconductor system may implement a fine-pitch interconnection between the semiconductor dies to support a relatively greater quantity of signal paths between the one or more memory arrays and the host interface which, in some examples, may support reducing or eliminating SERDES circuitry that might otherwise be implemented with coarser interconnection. Thus, in some implementations, the interconnections may be associated with relatively lower-level signaling of sense amplifiers of the first semiconductor die that are used to sense logic states from memory cells (e.g., in a read operation), and the lower-level signaling may be amplified at the second semiconductor die using the second portion of signal amplification circuitry. In some examples, the reduction or elimination of SERDES circuitry at the first semiconductor die supported by the described techniques may allow at least a portion of the first semiconductor die to be alternatively allocated to other circuitry or additional memory storage space. Additionally, or alternatively, reducing or eliminating SERDES circuitry may support lower-speed signaling for a given data rate, or decrease power consumption of the semiconductor system, or reduce heat generation of the semiconductor system, among other advantages.

In some implementations, a semiconductor system may be configured with multiple data paths (e.g., parallel data paths, redundant data paths), which may include different implementations of amplification circuitry. For example, a first data path may include portions of amplification circuitry that are divided between first and second semiconductor dies, and a second data path may include similar portions of amplification circuitry that are included on the same semiconductor die (e.g., the first semiconductor die) and, in some examples, may also include SERDES circuitry. The first data path may implement relatively fine-pitch interconnections between the semiconductor dies, and may be configured to support a primary connection (e.g., a high-performance connection, a high throughput connection) between memory arrays and a host interface. The second data path may implement relatively course-pitch interconnections between the semiconductor dies, and may be configured to support a secondary connection (e.g., a backup connection) between memory arrays and a host interface. For example, the semiconductor system may operate using the second data path in an event of failure or adverse operation associated with using the fine-pitch interconnections or other circuitry of the first data path. The semiconductor system may include a switching component configured to switch between the first data path and the second data path based on conditions of the semiconductor system (e.g., error conditions, operating mode conditions), which may be detected as part of memory system operations or by a host system that is coupled with the memory system via a host interface. By enabling multiple data paths, the semiconductor system may support a first data path with relatively high throughput and relatively low signal degradation, and a second data path which may provide a backup or diagnostic function, enabling flexible operations and diagnostic techniques, among other advantages, compared with other techniques for configuring a semiconductor system.

In addition to applicability in memory systems as described herein, techniques for data path signal amplification in coupled semiconductor systems may be generally implemented to support artificial intelligence or analytics applications. As the use of artificial intelligence increases to support machine learning, analytics, decision making, or other related applications, semiconductor systems that support artificial intelligence applications and processes may be desired. For example, artificial intelligence applications may be associated with accessing relatively large quantities of data for analytical purposes and may benefit from memory systems capable of effectively and efficiently storing relatively large quantities of data or accessing stored data relatively quickly. Implementing the techniques described herein may support artificial intelligence or machine learning techniques by providing relatively fine-pitch interconnections between directly-coupled semiconductor dies, thereby improving memory access throughput via a relatively higher quantity of signal paths, which may be coupled more directly with host processing capabilities, among other benefits.

Features of the disclosure are initially illustrated and described in the context of systems, dies, architectures, and sense components with reference to FIGS. 1 through 8. These and other features of the disclosure are further illustrated by and described in the context of an apparatus diagram and flowcharts with reference to FIGS. 9 through 11.

FIG. 1 illustrates an example of a system 100 that supports data path signal amplification in coupled semiconductor systems in accordance with examples as disclosed herein. The system 100 may include portions of an electronic device, such as a computing device, a mobile computing device, a wireless communications device, a graphics processing device, a vehicle, or other systems. The system 100 includes a host system 105, a memory system 110, and one or more channels 115 coupling the host system 105 with the memory system 110 (e.g., to provide a communicative coupling). The system 100 may include one or more memory systems 110, but aspects of the one or more memory systems 110 may be described in the context of a single memory system 110.

The host system 105 may be an example of a processor (e.g., circuitry, processing circuitry, a processing component) that uses memory to execute processes, such as a processing system of a computing device, a mobile computing device, a wireless communications device, a graphics processing device, a wearable device, an internet-connected device, a vehicle controller, a system on a chip (SoC), or other stationary or portable electronic device, among other examples. The host system 105 may include one or more of an external memory controller 120, a processor 125, a basic input/output system (BIOS) component 130, or other components (e.g., a peripheral component, an input/output controller, not shown). The components of the host system 105 may be coupled with one another using a bus 135.

An external memory controller 120 may be configured to enable communication of information (e.g., data, commands, control information, configuration information) between components of the system 100 (e.g., between components of the host system 105, such as the processor 125, and the memory system 110). An external memory controller 120 may process (e.g., convert, translate) communications exchanged between the host system 105 and the memory system 110. In some examples, an external memory controller 120, or other component of the system 100, or associated functions described herein, may be implemented by or be part of the processor 125. For example, an external memory controller 120 may be hardware, firmware, or software (e.g., instructions), or some combination thereof implemented by a processor 125 or other component of the system 100 or the host system 105. Although an external memory controller 120 is illustrated outside the memory system 110, in some examples, an external memory controller 120, or its functions described herein, may be implemented by one or more components of a memory system 110 (e.g., a memory system controller 155, a local memory controller 165) or vice versa. In various examples, the host system 105 or an external memory controller 120 may be referred to as a host.

A processor 125 may be operable to provide functionality (e.g., control functionality) for the system 100 or the host system 105. A processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination thereof. In some examples, a processor 125 may be an example of a central processing unit (CPU), a graphics processing unit (GPU), a general-purpose GPU (GPGPU), or an SoC, among other examples.

In some examples, the system 100 or the host system 105 may include an input component, an output component, or a combination thereof. Input components may include a sensor, a microphone, a keyboard, another processor (e.g., on a printed circuit board), an interface (e.g., a user interface, an interface between other devices), or a peripheral that interfaces with system 100 via one or more peripheral components, among other examples. Output components may include a display, audio speakers, a printing device, another processor on a printed circuit board, or a peripheral that interfaces with the system 100 via one or more peripheral components, among other examples.

The memory system 110 may be a component of the system 100 that is operable to provide physical memory locations (e.g., addresses) that may be used or referenced by the system 100. The memory system 110 may include a memory system controller 155 and one or more memory dies 160 (e.g., memory chips) to support a capacity for data storage. The memory system 110 may be configurable to work with one or more different types of host systems 105, and may respond to and execute commands provided by the host system 105 (e.g., via an external memory controller 120). For example, the memory system 110 (e.g., a memory system controller 155) may receive a write command indicating that the memory system 110 is to store data received from the host system 105, or receive a read command indicating that the memory system 110 is to provide data stored in a memory die 160 to the host system 105, or receive a refresh command indicating that the memory system 110 is to refresh data stored in a memory die 160, among other types of commands and operations.

A memory system controller 155 may include components (e.g., circuitry, logic) operable to control operations of the memory system 110. A memory system controller 155 may include hardware, firmware, or instructions that enable the memory system 110 to perform various operations, and may be operable to receive, transmit, or execute commands, data, or control information related to operations of the memory system 110. A memory system controller 155 may be operable to communicate with one or more of an external memory controller 120, one or more memory dies 160, or a processor 125. In some examples, a memory system controller 155 may control operations of the memory system 110 in cooperation with a local memory controller 165 of a memory die 160.

Each memory die 160 may include a local memory controller 165 and a memory array 170. A memory array 170 may be a collection of memory cells, with each memory cell being operable to store one or more bits of data. A memory die 160 may include a two-dimensional (2D) array of memory cells, or a three-dimensional (3D) array of memory cells. In some examples, a 2D memory die 160 may include a single memory array 170. In some examples, a 3D memory die 160 may include two or more memory arrays 170, which may be stacked or positioned beside one another (e.g., relative to a substrate).

A local memory controller 165 may include components (e.g., circuitry, logic) operable to control operations of a memory die 160. In some examples, a local memory controller 165 may be operable to communicate (e.g., receive or transmit data or commands or both) with a memory system controller 155. In some examples, a memory system 110 may not include a memory system controller 155, and a local memory controller 165 or an external memory controller 120 may perform various functions described herein. As such, a local memory controller 165 may be operable to communicate with a memory system controller 155, with other local memory controllers 165, or directly with an external memory controller 120, or a processor 125, or any combination thereof. Examples of components that may be included in a memory system controller 155 or a local memory controller 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, sense components for sensing states of memory cells of a memory array 170, write components for writing states to memory cells of a memory array 170, or various other components operable for supporting described operations of a memory system 110.

A host system 105 (e.g., an external memory controller 120) and a memory system 110 (e.g., a memory system controller 155) may communicate information (e.g., data, commands, control information, configuration information) using one or more channels 115. Each channel 115 may be an example of a transmission medium that carries information, and each channel 115 may include one or more signal paths (e.g., a transmission medium, an electrical conductor, an electrically conductive path) between terminals associated with the components of the system 100. For example, a channel 115 may be associated with a first terminal (e.g., including one or more pins, including one or more pads) at the host system 105 and a second terminal at the memory system 110. A terminal may be an example of a conductive input or output point of a device of the system 100, and a terminal may be operable to act as part of a channel 115. In some implementations, at least the channels 115 between a host system 105 and a memory system 110 may include or be referred to as a host interface (e.g., a physical host interface). In some implementations, a host interface may include or be associated with interface circuitry (e.g., signal drivers, signal latches) at the host system 105 (e.g., at an external memory controller 120), or at the memory system 110 (e.g., at a memory system controller 155), or both.

In some examples, a channel 115 (e.g., associated signal paths and terminals) may be dedicated to communicating one or more types of information. For example, the channels 115 may include one or more command and address channels, one or more clock signal channels, one or more data channels, among other channels or combinations thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols of a signal may be registered for each clock cycle (e.g., on both a rising edge and a falling edge of a clock signal).

In some implementations, a memory system 110 may include one or more data paths between memory arrays 170 and a host interface (e.g., between memory arrays 170 and channels 115, between memory arrays 170 and at least a portion of a memory system controller 155). To support a data rate along a data path, the memory system 110 may include SERDES circuitry that converts signaling between relatively slower signaling using relatively more signal paths and relatively faster signaling using relatively fewer signal paths. However, SERDES circuitry, among other data path circuitry, may involve multiple stages of signal amplification to maintain signal integrity along the data path, which may occupy an area of a memory die, or may be associated with a power consumption at the memory die, among other characteristics.

In accordance with examples as disclosed herein, a semiconductor system (e.g., a semiconductor implementation of a memory system 110, a semiconductor implementation of a system 100 that includes a memory system 110 and a host system 105) may implement a first semiconductor die (e.g., a memory die) including one or more memory arrays 170 and a second semiconductor die (e.g., a logic die) including a host interface (e.g., at least a portion of channels 115). The first semiconductor die may include a first portion of a data path between the memory arrays 170 and the host interface (e.g., at least a portion of a data path that includes functionality of a local memory controller 165 and a memory system controller 155), including a first portion of signal amplification circuitry (e.g., sense amplifiers configured to be coupled with memory cells of the memory arrays 170) of the data path. The second semiconductor die may include a second portion of the data path, including a second portion of signal amplification circuitry (e.g., data sense amplifiers, helper flip-flops) of the data path. The semiconductor system may implement a fine-pitch interconnection between the semiconductor dies to support a relatively greater quantity of signal paths between the one or more memory arrays 170 and the host interface which, in some examples, may support reducing or eliminating SERDES circuitry that might otherwise be implemented with coarser interconnection. Thus, in some implementations, the interconnections may be associated with relatively lower-level signaling of sense amplifiers of the first semiconductor die that are used to sense logic states from memory cells (e.g., in a read operation), and the lower-level signaling may be amplified at the second semiconductor die using the second portion of signal amplification circuitry. In some examples, the reduction or elimination of SERDES circuitry at the first semiconductor die supported by the described techniques may allow at least a portion of the first semiconductor die to be alternatively allocated to other circuitry or additional memory storage space. Additionally, or alternatively, reducing or eliminating SERDES circuitry may support lower-speed signaling for a given data rate, or decrease power consumption of the semiconductor system, or reduce heat generation of the semiconductor system, among other advantages.

In some implementations, a semiconductor system may be configured with multiple data paths (e.g., parallel data paths, redundant data paths), which may include different implementations of amplification circuitry. For example, a first data path may include portions of amplification circuitry that are divided between first and second semiconductor dies, and a second data path may include similar portions of amplification circuitry that are included on the same semiconductor die (e.g., the first semiconductor die) and, in some examples, may also include SERDES circuitry. The first data path may implement relatively fine-pitch interconnections between the semiconductor dies, and may be configured to support a primary connection (e.g., a high-performance connection, a high throughput connection) between memory arrays 170 and a host interface. The second data path may implement relatively course-pitch interconnections between the semiconductor dies, and may be configured to support a secondary connection (e.g., a backup connection) between memory arrays and a host interface. For example, the semiconductor system may operate using the second data path in an event of failure or adverse operation associated with using the fine-pitch interconnections or other circuitry of the first data path. The semiconductor system may include a switching component configured to switch between the first data path and the second data path based on conditions of the semiconductor system (e.g., error conditions, operating mode conditions), which may be detected as part of memory system operations or by a host system that is coupled with the memory system via a host interface. By enabling multiple data paths, the semiconductor system may support a first data path with relatively high throughput, and a second data path which may provide a backup or diagnostic function, enabling flexible operations and diagnostic techniques, among other advantages, compared with other techniques for configuring a semiconductor system.

Figure 2:
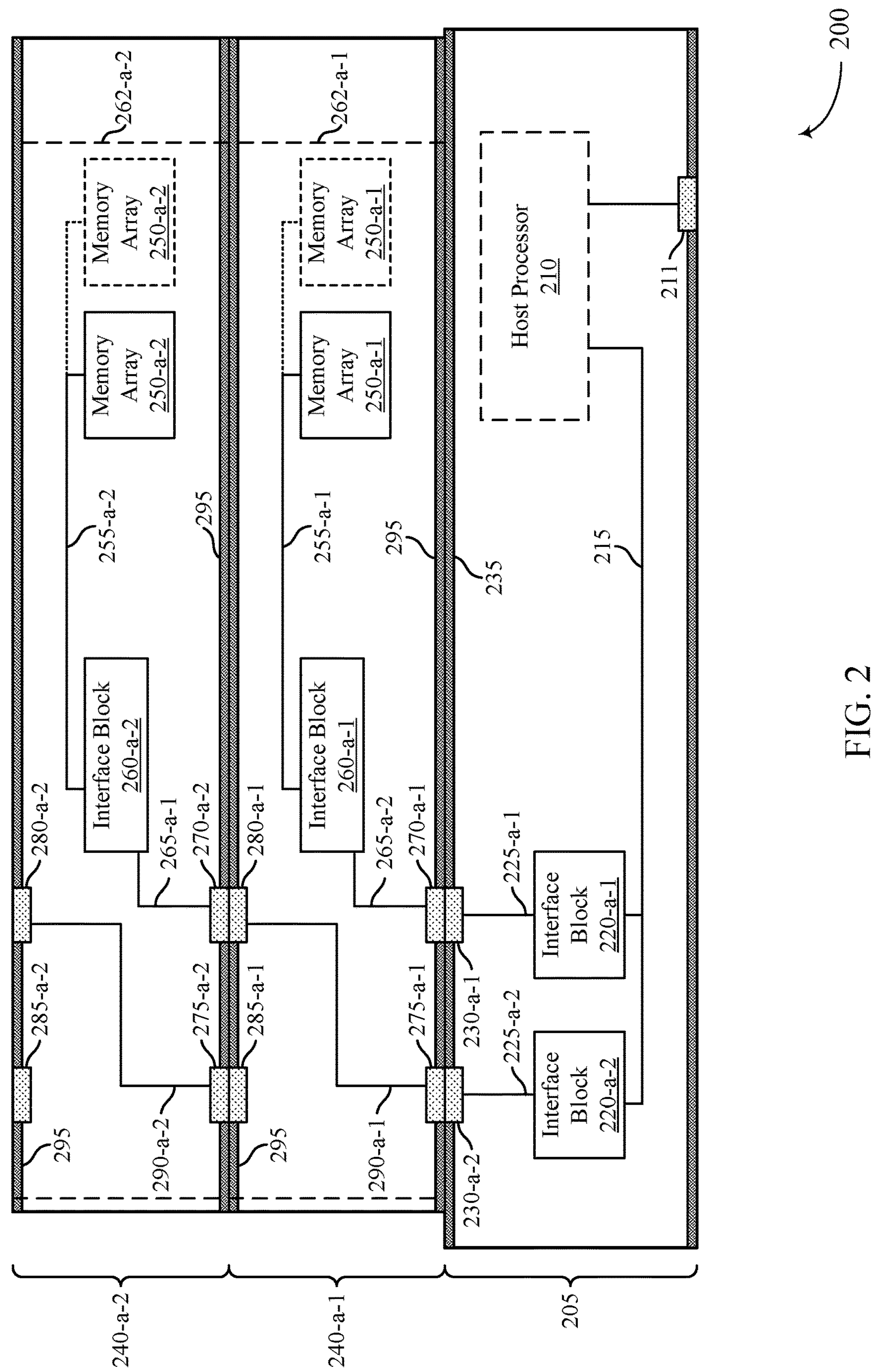
FIG. 2 illustrates an example of a system that supports data path signal amplification in coupled semiconductor systems in accordance with examples as disclosed herein.

FIG. 2 illustrates an example of a system 200 (e.g., a semiconductor system, a system of coupled semiconductor dies) that supports data path signal amplification in coupled semiconductor systems in accordance with examples as disclosed herein. The system 200 illustrates an example of a die 205 (e.g., a semiconductor die, a host die, a processor die, a logic die) that is coupled with one or more dies 240 (e.g., dies 240-*a*-1 and 240-*a*-2, semiconductor dies, memory dies, array dies). A die 205 or a die 240 may be formed using a respective semiconductor substrate (e.g., a substrate of crystalline semiconductor material such as silicon, germanium, silicon-germanium, gallium arsenide, or gallium nitride), or a silicon-on-insulator (SOI) substrate (e.g., silicon-on-glass (SOG), silicon-on-sapphire (SOS)), or epitaxial semiconductor materials formed on another substrate, among other examples. Although the illustrated example of a system 200 includes two dies 240, a system 200 in accordance with the described techniques may include any quantity of one or more dies 240 coupled with a die 205.

The system 200 illustrates an example of interface circuitry between a host and memory (e.g., via a host interface, via a physical host interface) that is implemented in (e.g., divided between) multiple semiconductor dies. For example, the die 205 may include a set of one or more interface blocks 220 (e.g., interface blocks 220-*a*-1 and 220-*a*-2, memory interface blocks), and each die 240 may include a set of one or more interface blocks 260 and one or more memory arrays 250 (e.g., die 240-*a*-1 including an interface block 260-*a*-1 coupled with a set of one or more memory arrays 250-*a*-1, die 240-*a*-2 including an interface block 260-*a*-2 coupled with a set of one or more memory arrays 250-*a*-2). In some implementations, the die 205 also may include a host processor 210. However, in some other implementations, a host processor 210 may be external to a die 205, such as in another semiconductor die or other component that is coupled with (e.g., communicatively coupled with, directly coupled with) the die 205 via one or more contacts 211. Although the example of system 200 is illustrated with one interface block 260 included in each die 240, a die 240 in accordance with the described techniques may include any quantity of one or more interface blocks 260, each coupled with a respective set of one or more memory arrays 250, and each coupled with a respective interface block 220 of a die 205. Thus, the interface circuitry of a system 200 may include one or more interface blocks 220 of a die 205, with each interface block 220 being coupled with (e.g., in communication with) a corresponding interface block 260 of a die 240 (e.g., external to the die 205). In some examples, a coupled combination of an interface block 220 and an interface block 260 may include or be referred to as a data path associated with a respective set of one or more memory arrays 250.

The host processor 210 may be an example of a host system 105, or a portion thereof (e.g., a processor 125, an external memory controller 120, or both). The host processor 210 may be configured to perform operations that implement storage of the memory arrays 250. For example, the host processor 210 may receive data read from the memory arrays 250, or transmit data to be written to the memory arrays 250, or both (e.g., in accordance with an application or other operations of the host processor 210). The memory arrays 250 may be examples of memory arrays 170, and may include memory cells of various architectures, such as RAM, DRAM, SDRAM, SRAM, FeRAM, MRAM, RRAM, PCM, chalcogenide, NOR, or NAND memory cells, or any combination thereof. The host processor 210 may be configured to communicate (e.g., transmit, receive) signaling with the interface blocks 220 over a host interface 215 (e.g., a physical host interface), which may implement aspects of channels 115 described with reference to FIG. 1. For example, the host processor 210 may be configured to transmit access signaling (e.g., control signaling, access command signaling), which may be received by the interface blocks 220 to support access operations (e.g., read operation, write operations) on the memory arrays 250.

A host interface 215 may include a respective set of one or more signal paths for each interface block 220, such that the host processor 210 communicates with each interface block 220 over the respective set of signal paths (e.g., in accordance with a selection of the respective set to perform access operations via an interface block 220 that is selected by the host processor 210). Additionally, or alternatively, a host interface 215 may include one or more signal paths that are shared among multiple interface blocks 220, and an interface block 220, or a host processor 210, or both may interpret, ignore, respond to, or inhibit response to signaling over shared signal paths of the host interface 215 based on a logical indication (e.g., an addressing indication associated with the interface block 220 or an interface enable signal, which may be provided by the host processor 210 or the corresponding interface block 220, depending on signaling direction).

Each interface block 220 may be coupled with at least a respective bus 225 of the die 205, and a respective bus 265 of a die 240, that is configured to communicate signaling with the corresponding interface block 260 (e.g., over one or more associated signal paths). For example, the interface block 220-*a*-1 may be coupled with the interface block 260-*a*-1 via a bus 225-*a*-1 and a bus 265-*a*-1, and the interface block 220-*a*-2 may be coupled with the interface block 260-*a*-2 via a bus 225-*a*-2 and a bus 265-*a*-2. In some examples, a die 240 may include a bus that bypasses operational circuitry of the die 240 (e.g., bypasses interface blocks 260 of a given die 240), such as a bus 290. For example, the interface block 220-*a*-2 may be coupled with the interface block 260-*a*-2 of the die 240-*a*-2 via a bus 290-*a*-1 of the die 240-*a*-1, which may bypass interface blocks 260 of the die 240-*a*-1. Such techniques may be extended for interconnection among more than two dies 240 (e.g., for interconnection via a respective bus 290 of multiple dies 240).

The respective signal paths of the buses 225, 265, and 290 may be coupled with one another, from one die to another, via various arrangements of contacts at the surfaces of interfacing dies. For example, the bus 225-*a*-1 may be coupled with the bus 265-*a*-1 via a contact 230-*a*-1 of (e.g., at a surface of) the die 205 and a contact 270-*a*-1 of the die 240-*a*-1, the bus 225-*a*-2 may be coupled with the bus 290-*a*-1 via a contact 230-*a*-2 of the die 205 and a contact 275-*a*-1 of the die 240-*a*-1, the bus 290-*a*-1 may be coupled with the bus 265-*a*-2 via a contact 280-*a*-1 of the die 240-*a*-1 and a contact 270-*a*-2 of the die 240-*a*-2, and so on. Although each respective bus is illustrated with a single line, coupled via singular contacts, it is to be understood that each signal path of a bus may be associated with respective contacts to support a separate communicative coupling via each signal path of a given bus. In some examples, a bus 290 may traverse a portion of a die 240 (e.g., in an in-plane direction, along a direction different from a thickness direction, in a waterfall arrangement), which may support an arrangement of contacts 230 along a surface of the die 205 being coupled with interface blocks 260 of different dies 240 along a stack direction (e.g., via contacts 275 and 280 that are non-overlapping when viewed along a thickness direction).

The interconnection of interfacing contacts may be supported by various techniques. For example, in a hybrid bonding implementation, interfacing contacts may be coupled by a fusion of conductive materials (e.g., electrically conductive materials) of the interfacing contacts (e.g., without solder or other intervening material between contacts). For example, in an assembled condition, the coupling of the die 205 with the die 240-*a*-1 may include a conductive material of the contact 230-*a*-2 being fused with a conductive material of the contact 275-*a*-1, and the coupling of the die 240-*a*-1 with the die 240-*a*-2 may include a conductive material of the contact 280-*a*-1 being fused with a conductive material of the contact 270-*a*-2, and so on. In some examples, such coupling may include an inoperative fusion of contacts (e.g., a non-communicative coupling, a physical coupling), such as a fusion of the contact 285-*a*-1 with the contact 275-*a*-2, neither of which are coupled with operative circuitry of the dies 240-*a*-1 or 240-*a*-2. In some examples, such techniques may be implemented to improve coupling strength or uniformity (e.g., implementing contacts 285, which may not be operatively coupled with an interface block 260 or an interface block 220), or such a coupling may be a byproduct of a repetition of components that, in various configurations, may be operative or inoperative. (e.g., where, for dies 240 with a common arrangement of contacts 275 and 285, contacts 275-*a*-1 and 280-*a*-1 provide a communicative path for the interface block 260-*a*-2 and the interface block 220-*a*-2, but the contacts 275-*a*-2 and 280-*a*-2 do not provide a communicative path between an interface block 260 and an interface block 220).

In some examples, a fusion of conductive materials between dies (e.g., between contacts) may be accompanied by a fusion of other materials at one or more surfaces of the interfacing dies. For example, in an assembled condition, the coupling of the die 205 with the die 240-*a*-1 may include a dielectric material 235 (e.g., an electrically non-conductive material) of the die 205 being fused with a dielectric material 295 of the die 240-*a*-1, and the coupling of the die 240-*a*-1 with the die 240-*a*-2 may include a dielectric material 295 of the die 240-*a*-1 being fused with a dielectric material 295 of the die 240-*a*-2. In some examples, such dielectric materials may include an oxide, a nitride, a carbide, an oxide-nitride, an oxide-carbide, or other conversion or doping of a semiconductor material of the die 205 or dies 240, among other materials that may support such fusion. However, coupling among dies 205 and dies 240 may be implemented in accordance with other techniques, which may implement solder, adhesives, thermal interface materials, and other intervening materials.

In some examples, dies 240 may be coupled in a stack (e.g., forming a "cube" or other arrangement of dies 240), and the stack may subsequently be coupled with a die 205. In some examples, a respective set of one or more dies 240 may be coupled with each die 205 of multiple dies 205 formed in a wafer (e.g., in a chip-to-wafer bonding arrangement, before cutting the wafer of dies 205), and the dies 205, coupled with their respective set of dies 240, may be separated from one another (e.g., by cutting at least the wafer of dies 205). In some other examples, a respective set of one or more dies 240 may be coupled with a respective diw 205 after the die 205 is separated from a wafer of dies 205 (e.g., in a chip-to-chip bonding arrangement).

The buses 225, 265, and 290 may be configured to provide a configured signaling (e.g., a coordinated signaling, a logical signaling, modulated signaling, digital signaling) between an interface block 220 and a corresponding interface block 260, which may involve various modulation or encoding techniques by a transmitting interface block (e.g., via a driver component of the transmitting interface block). In some examples, such signaling may be supported by (e.g., accompanied by) clock signaling communicated via the respective buses (e.g., in coordination with signal transmission). For example, the buses may be configured to convey one or more clock signals transmitted by the interface block 220 for reception by the interface block 260 (e.g., to trigger signal reception by a latch or other reception component of the interface block 260, to support clocked operations of the interface block 260). Additionally, or alternatively, the buses may be configured to convey one or more clock signals transmitted by the interface block 260 for reception by the interface block 220 (e.g., to trigger signal reception by a latch or other reception component of the interface block 220, to support clocked operations of the interface block 220). Such clock signals may be associated with the communication (e.g., unidirectional communication, bidirectional communication) of various, such as control signaling, command signaling, data signaling, or any combination thereof. For example, the buses may include one or more signal paths for communications of a data bus (e.g., a DQ bus, via a data interface of the interface blocks) in accordance with one or more corresponding clock signals (e.g., data clock signals), or one or more signal paths for communications of a control bus (e.g., a command/address (C/A) bus, via a command interface of the interface blocks) in accordance with one or more clock signals (e.g., control clock signals), or any combination thereof.

Interface blocks 220 and 260 each may include circuitry in various configurations (e.g., hardware configurations, logic configurations, software or instruction configurations) that support the functionality allocated to the respective interface block for accessing a corresponding set of memory arrays 250. For example, interface blocks 220 may include circuitry configured to perform a first subset of operations that support access of the memory arrays 250, and interface blocks 260 may include circuitry configured to support a second subset of operations that support access of the memory arrays 250. In some examples, the interface blocks 220 and 260 may support a functional split or distribution of functionality associated with a memory system controller 155, a local memory controller 165, or both across multiple dies (e.g., a die 205 and at least one die 240). Such subsets of operations may include operations performed in response to commands from the host processor 210, or operations performed without commands from the host processor 210 (e.g., operations determined within an interface block 220 or within an interface block 260), or various combinations thereof. In some examples, the circuitry of interface blocks 220, or interface blocks 260, or both may include components (e.g., transistors) formed at least in part from doped portions of a substrate of the respective die where, in some examples, a substrate of a die 205 may have characteristics that are different from those of a substrate of a die 240.

In some examples, the interface blocks 220 may include circuitry configured to receive first access command signaling from the host processor 210 (e.g., via a host interface 215, via one or more contacts 211, where applicable), and to transmit second access command signaling to the respective (e.g., coupled) interface block 260 based on (e.g., in response to) the received first access command signaling. The interface blocks 260 may accordingly include circuitry configured to receive the second access command signaling from the respective interface block 220, and to access a respective set of one or more memory arrays 250 based on (e.g., in response to) the received second access command signaling. In various examples, the first access command signaling may include access commands that are associated with a type of operation (e.g., a read operation, a write operation, a refresh operation, a memory management operation), which may be associated with an indication of an address of the one or more memory arrays 250 (e.g., a logical address, a physical address). In some examples, the first access command signaling may include an indication of a logical address associated with the memory arrays 250, and circuitry of an interface block 220 may be configured to generate the second access command signaling to indicate a physical address associated with the memory arrays 250 (e.g., a row address, a column address, using a logical-to-physical (L2P) table or other mapping or calculation functionality of the interface block 220).

In some examples, to support write operations of the system 200, circuitry of the interface blocks 220 may be configured to receive (e.g., from the host processor 210, via a host interface 215, via one or more contacts 211, where applicable) first data signaling associated with the first access command signaling, and to transmit second data signaling (e.g., associated with second access command signaling) based on received first access command signaling and first data signaling. The interface blocks 260 may accordingly be configured to receive second data signaling, and to write data to one or more memory arrays 250 (e.g., in accordance with an indicated address associated with the first access command signaling) based on the received second access command signaling and second data signaling. In some examples, the interface blocks 220 may include an error control functionality (e.g., error detection circuitry, error correction circuitry, error correction code (ECC) logic, an ECC engine) that supports the interface blocks 220 generating the second data signaling based on performing an error control operation using the received first data signaling (e.g., detecting or correcting an error in the first data signaling, determining one or more parity bits to be conveyed in the second data signaling and written with the data).

In some examples, to support read operations of the system 200, circuitry of the interface blocks 260 may be configured to read data from the memory arrays 250 based on received second access command signaling, and to transmit first data signaling based on the read data. The interface blocks 220 may accordingly be configured to receive first data signaling, and to transmit second data signaling (e.g., to the host processor 210, via a host interface 215, via one or more contacts 211, where applicable) based on the received first data signaling. In some examples, the interface blocks 220 may include an error control functionality that supports the interface blocks 220 generating the second data signaling based on performing an error control operation using the received first data signaling (e.g., detecting or correcting an error in the first data signaling, which may include a calculation involving one or more parity bits received with the first data signaling).

In some examples, access command signaling that is transmitted by the interface blocks 220 to the interface blocks 260 may be generated (e.g., based on access command signaling received from a host processor 210, based on initiation signaling received from a host processor 210, without receiving or otherwise independent from signaling from a host processor 210) in accordance with various determination or generation techniques configured at the interface blocks 220 (e.g., based on a configuration for accessing memory arrays 250 that is modified at the interface blocks 220). Such techniques may support the interface blocks 220 configuring aspects of the access operations performed on the memory arrays 250 by a respective interface block 260.

A die 240 may include one or more units 262 (e.g., modules) that are separated from a semiconductor wafer having a pattern of units 262. Although each die 240 of the system 200 is illustrated with a single unit 262 (e.g., unit 262-*a*-1 of die 240-*a*-1, unit 262-*a*-2 of die 240-*a*-2), a die 240 in accordance with the described techniques may include any quantity of units 262, which may be arranged in various patterns (e.g., sets of one or more units 262 along a row direction, sets of one or more units 262 along a column direction, among other patterns). Each unit 262 may include at least the circuitry of a respective interface block 260, along with memory array(s) 250, a bus 255, a bus 265, and one or more contacts 270 corresponding to the respective interface block 260. In some examples, where applicable, each unit 262 may also include one or more buses 290, contacts 275, contacts 280, or contacts 285 (e.g., associated with a respective interface block 260 of a unit 262 of a different die 240), which may support various degrees of stackability among or via units 262 of other dies 240.

In accordance with examples as disclosed herein, the system 200 may be configured such that dies 240 include a first portion of a data path between the memory arrays 250 and the host interface 215, including a first portion of signal amplification circuitry (e.g., in one or more interface blocks 260), and such that a die 205 includes a second portion of the data path, including a second portion of signal amplification circuitry (e.g., in one or more interface blocks 220). The system 200 may implement a fine-pitch interconnection between the dies 240 and 205 (e.g., interconnections of at least contacts 230 with contacts 270, and, where applicable, contacts 275 and 280) to support a relatively greater quantity of signal paths (e.g., of at least buses 225 and 265 and, where applicable, buses 290) which, in some examples, may support reducing or eliminating SERDES circuitry that might otherwise be implemented (e.g., in interface blocks 260) with coarser interconnection. Thus, in some implementations, contacts of the data path (e.g., contacts 230 and 270 and, where applicable, contacts 275 and 280) may be associated with relatively lower-level signaling (e.g., read signaling) of sense amplifiers of the interface blocks 260, and the lower-level signaling may be amplified at the interface blocks 220 using the second portion of signal amplification circuitry. In some examples, the reduction or elimination of SERDES circuitry (e.g., from dies 240) supported by the described techniques may allow at least a portion of the dies 240 to be alternatively allocated to other circuitry (e.g., additional circuitry of interface blocks 260) or additional memory storage space (e.g., larger or a greater quantity of memory arrays 250). Additionally, or alternatively, reducing or eliminating SERDES circuitry may support lower-speed signaling for a given data rate, or decrease power consumption of the semiconductor system, or reduce heat generation of the system 200, among other advantages.

Figure 3:
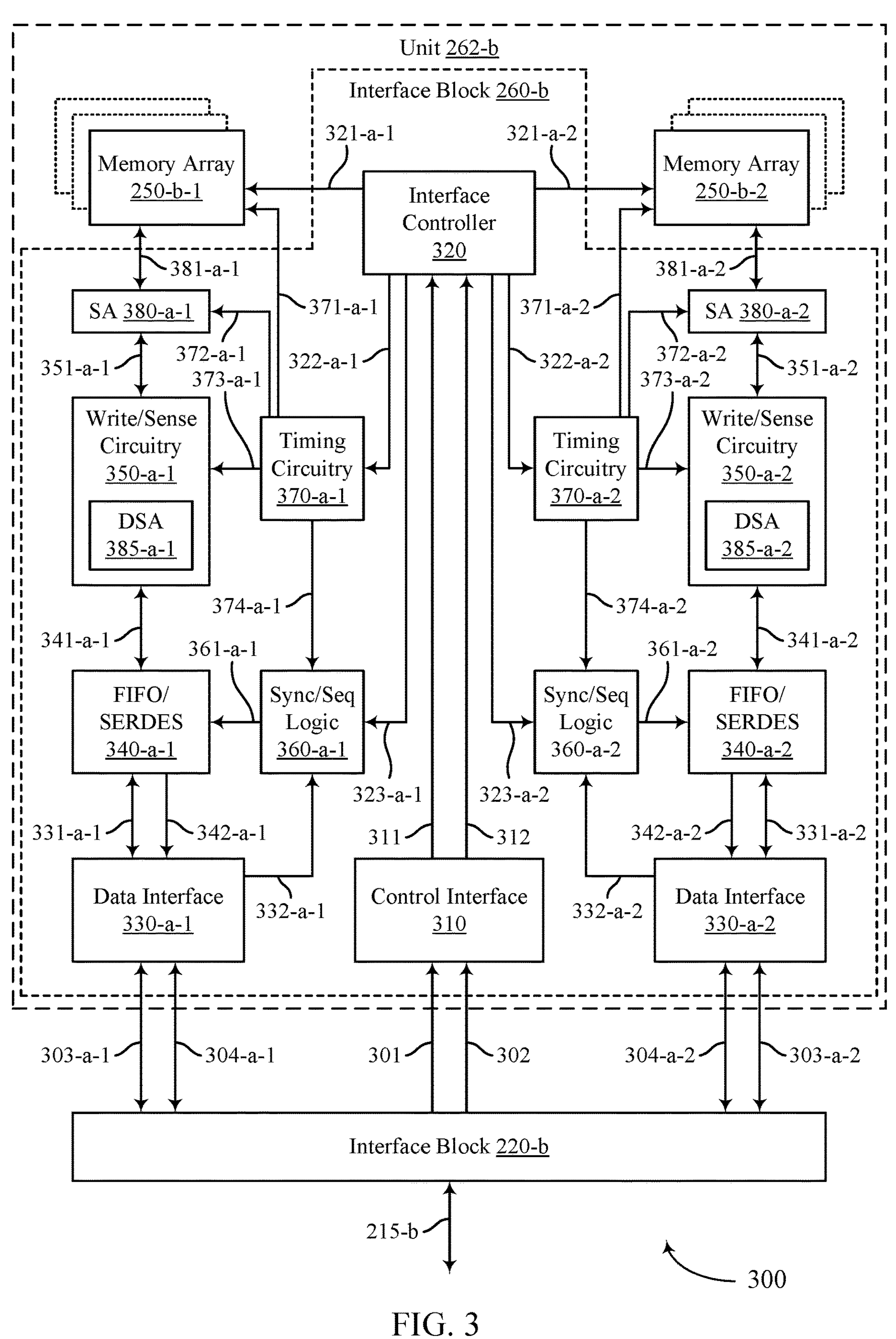
FIGS. 3 and 4 illustrate examples of architectures that support data path signal amplification in coupled semiconductor systems in accordance with examples as disclosed herein.

FIG. 3 illustrates an example of an architecture 300 that supports data path signal amplification in coupled semiconductor systems in accordance with examples as disclosed herein. The architecture 300 illustrates an example of an interface block 260-*b* (e.g., of a dic 240) and an interface block 220-*b* (e.g., of a die 205) that may be coupled between memory arrays 250-*b* and a bus 215-*b* (e.g., a host interface). In the example of architecture 300, the interface block 260-*b* may be communicatively coupled with the interface block 220-*b* via one or more channels, such as channels associated with a bus 301, a bus 302, buses 303, and buses 304, each of which may be examples of one or more signal paths of a bus 225 and a bus 265, as well as a bus 290, where applicable. Circuitry of the interface block 260-*b* may be included in an example of a unit 262-*b* along with its corresponding memory arrays 250-*b*.

The interface block 260-*b* includes a control interface 310 (e.g., a command interface), which may be configured to communicate signaling with the interface block 220-*b*. For example, the control interface 310 may include circuitry (e.g., a receiver, one or more latches) configured to receive control signaling (e.g., modulated control signaling, access command signaling, configuration signaling, address signaling, such as row address signaling or column address signaling) over the bus 301 (e.g., associated with a control channel). The control interface 310 also may include circuitry configured to receive clock signaling (e.g., clock signaling associated with the control interface 310, clock signaling having one or more phases, such as true and complement phases, dk_t/c signaling from the interface block 220-*b*) over the bus 302 (e.g., associated with a clock channel, such as a control clock channel), which the control interface 310 may use for receiving the control signaling of the bus 301 (e.g., for triggering the one or more latches). The control interface 310 may transmit (e.g., forward) the control signaling over a bus 311, and may transmit the clock signaling over a bus 312 (e.g., for timing of other operations of the interface block 260-*b*), each of which may be received by an interface controller 320.

The interface block 260-*b* also includes two data interfaces 330 (e.g., data interfaces 330-*a*-1 and 330-*a*-2), which also may be configured to communicate signaling with the interface block 220-*b*. Each data interface 330 may include corresponding buses and circuitry, the operation of which may be associated with (e.g., controlled by, coordinated with, operated based on) control signaling via the control interface 310. Although the example of interface block

260-*b* includes two such data interfaces 330 associated with the control interface 310 (e.g., in a "channel pair" arrangement), the described techniques for an interface block 260 may include any quantity of one or more data interfaces 330, and associated buses and circuitry, for a given control interface 310 of the interface block 260. Each data interface 330 may be associated with respective data path circuitry, which may include respective first-in-first-out (FIFO) and serialization/deserialization (SERDES) circuitry (e.g., FIFO/SERDES 340), respective write/sense circuitry 350, respective synchronization and sequencing circuitry (e.g., sync/seq logic 360), and respective timing circuitry 370, along with interconnecting signal paths (e.g., one or more buses). However, in some other examples, data path circuitry may be arranged in a different manner, or may include different circuitry components, which may include circuitry that is dedicated to respective data paths, or shared among data paths, or various combinations thereof. Each data interface 330 also may be associated with a respective set of one or more memory arrays 250. In some examples, each memory array 250 may be understood to include respective addressing circuitry such as bank logic or decoders (e.g., a row decoder, a column decoder), among other array circuitry. However, in some other examples, at least a portion of such circuitry may be included in the interface block 260.

Each data interface 330 may include circuitry (e.g., one or more latches, one or more drivers) configured to communicate (e.g., receive, transmit) data signaling (e.g., modulated data signaling, DQ signaling) over a respective bus 303 (e.g., associated with a data channel). Each data interface 330 also may include circuitry to communicate clock signaling over a respective bus 304 (e.g., associated with a clock channel, such as a data clock channel), which may support clock signal reception by the data interface 330 (e.g., first clock signaling associated with the data interface 330, clock signaling having one or more phases, such as true and complement phases, DQS_t/c signaling from the interface block 220-*b*, clock signaling associated with data reception or write operations), or clock signal transmission by the data interface 330 (e.g., second clock signaling associated with the data interface 330, RDQS_t/c signaling to the interface block 220-*b*, clock signaling associated with data transmission or read operations), or both. Each data interface 330 may transmit clock signaling (e.g., received clock signaling, DQS_t/c signaling) over a respective bus 332 (e.g., for timing of other operations of the interface block 260-*b*).

The interface controller 320 may support various control or configuration functionality of the interface block 260-*b* for accessing or otherwise managing operations of the coupled memory arrays 250-*b*. For example, the interface controller 320 may support access command coordination or configuration, latency or timing compensation, access command buffering (e.g., in accordance with a first-in-first-out FIFO or other organizational scheme), mode registers or logic for configuration settings, or test functionality, among other functions or combinations thereof. For each data path of the interface block 260 (e.g., associated with a respective data interface 330), the interface controller 320 may be configured to transmit signaling to the respective memory arrays 250 over a bus 321 (e.g., address signaling, such as a row address or row activation signaling), to transmit signaling to the respective timing circuitry 370 over a bus 322 (e.g., timing signaling, which may be based on clock signaling received via the bus 312, configuration signaling), and to transmit signaling to the respective sync/seq logic 360 over a bus 323 (e.g., timing signaling, which may be based on clock signaling received via the bus 312, configuration signaling).

For each data path, the respective timing circuitry 370 may support timing of various operations (e.g., activations, coupling operations, signal latching, signal driving) relative to timing signaling received over a bus 322. For example, timing circuitry 370 may include a timing chain (e.g., a global column timing chain) configured to generate one or more clock signals or other initiation signals for controlling operations of the respective data path, and such signaling may include transitions (e.g., rising edge transitions, falling edge transitions, on/off transitions) that are offset from, at a different rate than, or otherwise different from transitions of signaling over the bus 322 to support a given operation or combination of operations. For example, timing circuitry 370 may be configured to transmit signaling to the respective memory arrays 250 over a bus 371 (e.g., column selection signaling, column address signaling), to transmit signaling to the respective sense amplifier (SA) circuitry 380 over a bus 372 (e.g., latch or driver timing signaling), to transmit signaling to the respective write/sense circuitry 350 over a bus 373 (e.g., latch or driver timing signaling), and to transmit signaling to the respective sync/seq logic over a bus 374 (e.g., timing signaling).

For each data path, the respective FIFO/SERDES 340 may be configured to convert between data signaling of a first bus width (e.g., a relatively wide bus width, associated with a bus 341, having a relatively larger quantity of signal paths), and a second bus width (e.g., a relatively narrow bus width, associated with a bus 331, having a relatively smaller quantity of signal paths). In some examples, such a conversion may be accompanied by changing a rate of signaling between the bus 341 and the bus 331 (e.g., to maintain a given throughput). For example, a FIFO/SERDES 340 may support a conversion between the bus 341 having a bus width of 288 signal paths (e.g., for signaling Dat[287:0]) and the bus 331 having a bus width of 72 signal paths (e.g., for signaling DQ[71:0]), in which case a rate of signaling over the bus 331 may be four times as fast as a rate of signaling over the bus 341. In various examples, the FIFO/SERDES 340 may receive data signaling over the bus 331 and transmit data signaling over the bus 341 (e.g., to support a write operation), or may receive data signaling over the bus 341 and transmit data signaling over the bus 331 (e.g., to support a read operation). In some examples, (e.g., to support a read operation), the FIFO/SERDES 340 may be configured to transmit clock signaling (e.g., RDQS_t/c signaling) to the data interface 330, which may be forwarded to the interface block 220-*b* (e.g., over a bus 304, for reception of data signaling by the interface block 220-*b* received over a bus 331).

The timing or other synchronization of operations performed by the FIFO/SERDES 340 may be supported by one or more clock signals, among other signaling, received from the respective sync/seq logic 360 (e.g., over a bus 361). For example, the sync/seq logic 360 may generate or otherwise coordinate clock signaling to support the different rates of signaling of the bus 331 and the bus 341 (e.g., based on clock signaling received over a bus 332 and a bus 373). Additionally, or alternatively, the FIFO/SERDES 340 may operate in a direction (e.g., for data transmission to a data interface 330, for data reception from a data interface 330) or other mode based on configuration signaling received from the sync/seq logic 360.

For each data path, respective sense amplifier circuitry 380 (e.g., sense amplifiers, a sense amplifier array, a first stage of signal amplification) may be configured to access the respective set of one or more memory arrays 250. In some cases, the sense amplifier circuitry 380 may be coupled with the memory arrays 250 over a respective bus 381, which may include respective signal paths associated with each memory array 250, or may include signal paths that are shared for all of the memory arrays 250 of the set, in which case the memory array circuitry may include multiplexing circuitry operable to couple the bus 381 with a selected one of the memory arrays 250. In some examples, a bus 381 may include a same quantity of signal paths as a quantity of columns in each memory array 250. In some other examples, the memory arrays 250 may include a quantity of columns that is an integer multiple of the quantity of signal paths of a bus 381, in which case the memory array circuitry (e.g., each memory array 250) may include decoding circuitry operable to couple a subset of columns of memory cells, or associated circuitry, with the bus 381. In some implementations, decoding circuitry may be implemented at the sense amplifier circuitry 380.

Sense amplifiers of the sense amplifier circuitry 380 may be configured to output read signals based on accessing memory cells of the one or more memory arrays 250 coupled with the sense amplifier circuitry 380. For example, a sense amplifier of the sense amplifier circuitry 380 may output a read signal based on latching a difference between a reference signal and an access signal associated with coupling a memory cell of a memory array 250 with the sense amplifier. In some examples, such a latching may be implemented using cross-coupled transistor pairs to output a read signal indicative of the difference between the access signal and the reference signal (e.g., indicative of a logic state stored by the accessed memory cell). For example, the sense amplifier circuitry 380 may implement p-type n-type sense amplifiers (PNSAs).

For each data path, the respective write/sense circuitry 350 may be configured to support the accessing (e.g., data signaling, write signaling, read signaling) of the respective set of one or more memory arrays 250. For example, the write/sense circuitry 350 may be coupled with the sense amplifier circuitry 380 over a respective bus 351 (e.g., a global input/output (GIO) bus). In some examples, a bus 351 may include a same quantity of signal paths as a quantity of sense amplifiers of the sense amplifier circuitry 380. In some examples, a bus 351 may include a same quantity of signal paths as a bus 341 (e.g., for signaling GIO[287:0]). In some other examples, the sense amplifier circuitry 380 may include a quantity of sense amplifiers that is an integer multiple of the quantity of signal paths of a bus 351, in which case the sense amplifier circuitry 380 may include decoding circuitry operable to couple a subset of sense amplifiers with the bus 351. In some implementations, decoding circuitry may be implemented at the write/sense circuitry 350.

To support write operations, the write/sense circuitry 350 (e.g., data sense amplifier circuitry (DSA) of the write/sense circuitry 350) may be configured to drive signaling (e.g., over the bus 351) that is operable to write one or more logic states to memory cells of the memory arrays 250 (e.g., based on data received over a bus 341, based on timing signaling received over a bus 371, based on data signaling received over a bus 303 and on control signaling received over a bus 301). Such signaling may be transmitted to supporting circuitry of or otherwise associated with the memory arrays 250 (e.g., as an output of signals corresponding to logic states to be written), such as the sense amplifier circuitry 380. The sense amplifier circuitry 380, for example, may implement or control operations associated with voltage sources, current sources, or other driver circuitry operable to apply a bias across a storage element of the memory cells (e.g., across a capacitor, across a ferroelectric capacitor), or apply a charge, a current, or other signaling to a storage element of the memory cells (e.g., to apply a current to a chalcogenide or other configurable memory material, to apply a charge to a gate of a NAND memory cell), among other examples.

To support read operations, the write/sense circuitry 350 may be configured to receive signaling (e.g., over the bus 351) that the write/sense circuitry 350 (e.g., DSA circuitry 385, a second stage of amplification circuitry) may further amplify for communication through the interface block 260-*b*. The DSA circuitry 385 may include data sense amplifiers or helper flip-flops, which may be configured to receive signaling from sense amplifiers of the sense amplifier circuitry 380 over the bus 351. For example, the DSA circuitry 385 may be configured to receive signaling corresponding to logic states read from the sense amplifier circuitry 380, but at a relatively low driver strength (e.g., relatively 'analog' signaling, which may be associated with a relatively low drive strength of the sense amplifier circuitry 380). The DSA circuitry 385 may have a relatively high drive strength (e.g., for driving relatively 'digital' signaling over the bus 341), thereby amplifying the read signals received from the sense amplifier circuitry 380. In some examples, a voltage of contacts associated with the buses 303-*a* may be driven by write/sense circuitry 350-*a* or FIFO/SERDES 340-*a* during read operations (e.g., via a data interface 330-*a*), and a voltage of contacts associated with the buses 303-*a* may be driven by the interface block 220-*b* (e.g., a logical driver) during write operations.

The features of the architecture 300 may be duplicated in various quantities and arrangements to support a semiconductor system having multiple dies, such as various examples of a system 200. In an example implementation, each die 240 may be configured with 64 instances of the interface block 260-*b* (e.g., 64 units 262-*b*, each associated with one or more data paths), which may support a data signaling width of 9,216 signal paths for each die 240 (e.g., where each bus 303 of a channel pair is associated with 72 signal paths). For a system 200 having a stack of eight dies 240 coupled with a die 205, the die 205 may thus be configured with 512 instances of the interface block 220-*b*, thereby supporting an overall data signaling width of 73,738 signal paths for the system 200. However, in other implementations, dies 205 and dies 240 may be configured with different quantities of interface blocks 220 and 260, respectively, and a system 200 may be configured with different quantities of dies 240 per die 205.

In some examples, techniques for interconnection between semiconductor dies may be associated with a contact density limitation (e.g., a quantity of contacts in a given area of interconnection). Thus, to support a data rate along buses 303 (e.g., between the interface block 260-*b* and the interface block 220-*b*, between a die 240 and a die 205), the interface block 260-*b* may include FIFO/SERDES 340 to convert signaling between relatively slower signaling using relatively more signal paths of a bus 341 and relatively faster signaling using relatively fewer signal paths of a bus 331 and, accordingly, of a bus 303. In some such implementations, the FIFO/SERDES may accordingly support buses 303 with relatively fewer interconnections of contacts between a die 240 and a die 205. However, the FIFO/SERDES 340 of the interface block 260-*b* may rely in an implementation of DSA circuitry 385 at the interface block

260-*b*, or may occupy an area of a die 240, or may be associated with a power consumption or heat generation at a die 205, among other characteristics. Thus, in some examples that support a finer-pitch interconnection, a system 200 may implement a different architecture that reduces or eliminates FIFO/SERDES 340 (e.g., at least from an interface block 260), which may involve a greater quantity of signal paths between a die 240 and a die 205 at a bus 351.

Figure 4:
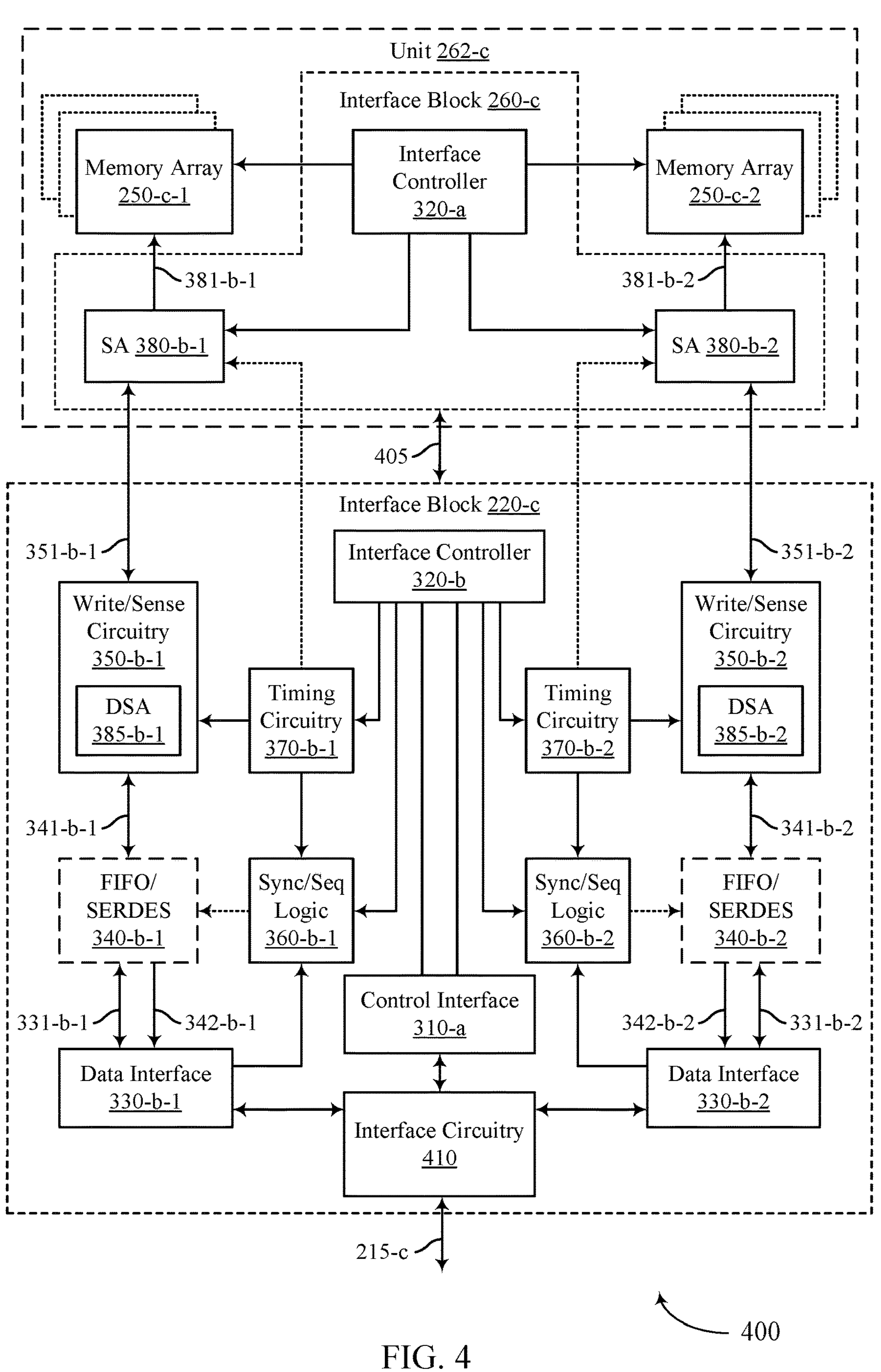

FIG. 4 illustrates an example of an architecture 400 that supports data path signal amplification in coupled semiconductor systems in accordance with examples as disclosed herein. The architecture 400 illustrates an example of an interface block 260-*c* (e.g., of a die 240) and an interface block 220-*c* (e.g., of a die 205) that may be coupled between memory arrays 250-*c* and a host interface 215-*c* (e.g., a host interface). In the example of architecture 400, the interface block 260-*c* may be communicatively coupled with the interface block 220-*c* via one or more channels, such as channels associated with buses 351 (e.g., a GIO bus) and, where applicable, a bus 405, each of which may be examples of one or more signal paths of a bus 225 and a bus 265, as well as a bus 290, where applicable. Circuitry of the interface block 260-*c* may be included in an example of a unit 262-*c* along with its corresponding memory arrays 250-*c*. In some cases, data path circuitry may be arranged or distributed in a different manner than depicted, or may include different circuitry components, which may include circuitry that is dedicated to respective data paths, or shared among data paths, or various combinations thereof.

The architecture 400 illustrates an example of implementing a data path between memory arrays 250-*c* and a host interface 215-*c* with a different distribution of components between an interface block 260 and an interface block 220 (e.g., between a die 240 and a die 205) than the architecture 300. For example, the interface block 260-*c* may include a first stage of signal amplification (e.g., sense amplifier circuitry 380-*b*), and the interface block 220-*c* may include a second stage of signal amplification (e.g., DSA circuitry 385-*b*). In some examples, such techniques may be supported by relatively fine-pitch interconnection between a die 240 and a die 205, which may support a relatively higher quantity of signal paths that may be associated with buses 351-*b*. In some such examples, a voltage of contacts associated with the buses 351-*b* may be driven by sense amplifier circuitry 380-*b* during read operations, and a voltage of contacts associated with the buses 351-*b* may be driven by write/sense circuitry 350-*b* (e.g., DSA circuitry 385-*b*) during write operations.

The example of architecture 400 also illustrates an example of how other supporting circuitry may be distributed between a die 240 and a die 205 (e.g., between interface blocks 260 and 220). For example, the interface block 260-*c* may include an interface controller 320-*a* and the interface block 220-*c* may include an interface controller 320-*b*, which may be an illustrative division of the functionality of an interface controller 320 described with reference to the architecture 300. In some implementations, where applicable, an interface controller 320-*a* and an interface controller 320-*b* may exchange signaling via a bus 405. Further, in the example of architecture 400, the interface block 220-*c* includes timing circuitry 370-*b*, sync/seq logic 360-*b*, and a control interface 310-*a*, which may be an illustrative distribution of the respective components described with reference to the architecture 300. The interface block 220-*c* may also include interface circuitry 410 operable to couple with the host interface 215-*c*, where the interface circuitry 410 may be operable to perform coordination of communications with a host system 105, error control operations (e.g., error detection operations, error correction operations), diagnostic operations, or other functionality associated with supporting operations of the architecture 400.

In some implementations, sense amplifier circuitry 380 may be operable based on timing signals at the interface block 260-*a*, which may be provided from timing circuitry 370. In some other implementations, sense amplifier circuitry 380 may be operable based on timing signals that are provided from interface controller 320-*a*, which may be otherwise based on clock signaling or other signaling received from the interface block 220-*c* (e.g., from the interface controller 320-*b*, from timing circuitry 370). In various other examples in accordance with the described techniques for data path amplification, any one or more of a control interface 310, an interface controller 320, sync/seq logic 360, or timing circuitry 370, or representative functionality thereof, may be distributed differently (e.g., in whole or in part) between an interface block 260 and an interface block 220.

In some implementations of the architecture 400, the interface block 220-*c* may include FIFO/SERDES 340-*b*, which may be configured to convert between data signaling of a relatively wide bus width (e.g., associated with a bus 341-*b*), having a relatively larger quantity of signal paths, and a relatively narrow bus width (e.g., associated with a bus 331-*b*), having a relatively smaller quantity of signal paths. In some examples, such a conversion may be accompanied by changing a rate of signaling between the bus 341 and the bus 331. In various examples, the FIFO/SERDES 340-*b* may be associated with a different (e.g., smaller) ratio of conversion than FIFO/SERDES 340-*a* implemented in the architecture 300.

In some other implementations of the architecture 400, FIFO/SERDES 340-*b* may be omitted from the interface block 220-*c*, which may be accompanied by write/sense circuitry 350-*b* being coupled with (e.g., directly coupled with) a respective data interface 330-*b*. Thus, in some such implementations, a data interface 330-*b* may be coupled with write/sense circuitry 350 using a bus having a same quantity of signal paths as a bus 341 which, in some examples, may be a same quantity of signal paths as a bus 351 (e.g., associated with a GIO bus). Omitting FIFO/SERDES 340-*b* may support implementing the DSA circuitry 385-*b* in the interface block 220-*c*, rather than in the interface block 260-*c* (e.g., in accordance with the example of architecture 300). Moreover, omitting FIFO/SERDES 340-*b* may conserve space on a die 205 or a die 240, or may decrease power consumption or heat generation otherwise associated with performing serialization or deserialization, among other advantages.

Figure 5:
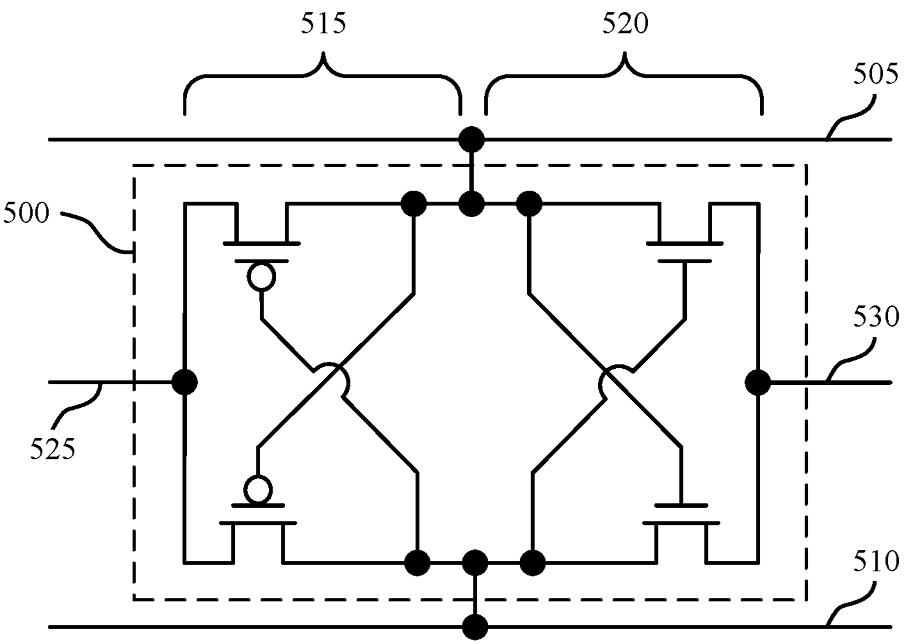
FIG. 5 illustrates an example of a sense amplifier that supports data path signal amplification in coupled semiconductor systems in accordance with examples as disclosed herein.

FIG. 5 illustrates an example of a sense amplifier 500 that supports data path signal amplification in coupled semiconductor systems in accordance with examples as disclosed herein. The sense amplifier 500 may be an example of amplification circuitry that may be implemented in sense amplifier circuitry 380 (e.g., an array sense amplifier). The sense amplifier 500 illustrates an example of circuitry configured to output a read signal based on latching a difference between a reference signal and an access signal associated with coupling a memory cell of the memory array 250 with the sense amplifier 500.

The sense amplifier 500 may be coupled with an access line 505 (e.g., at a first node) and an access line 510 (e.g., at a second node). In some examples, the access line 505 may be an example of or may be coupled with a digit line of a memory array 250. In some examples, the access line 510 may be an example of or may be coupled with a reference signal source associated with operating the memory array 250. In some other examples, the access line 510 may be an example of or may be coupled with a complementary digit line of a memory array 250, which may be associated with accessing a different storage element (e.g., a complementary storage element) than a storage element accessed via the access line 505.

The sense amplifier 500 may include a P-sense amp 515 including a pair of cross-coupled p-type transistors (e.g., p-channel metal oxide semiconductor (PMOS) transistors), and an N-sense amp 520 including a pair of cross coupled n-type transistors (e.g., n-channel metal oxide semiconductor (NMOS) transistors). However, other configurations of a sense amplifier may be implemented in sense amplifier circuitry 380 in accordance with the described techniques, including other examples of a pair of opposed differential amplifiers coupled between the access lines 505 and 510. The sense amplifier 500 may also be coupled with a supply 525 (e.g., a high sense amplifier voltage supply) and supply 530 (a low sense amplifier voltage supply), which may each be operable to provide voltages for latching a difference between voltages input via access lines 505 and 510 (e.g., associated with output signal voltage levels).

The sense amplifier 500 may output a read signal (e.g., as a difference between voltages latched at the first and second nodes) based on a difference between a reference signal and an access signal. For example, coupling a memory cell with access line 505 may provide an access signal on the access line 505, and coupling a reference with access line 510 may provide a reference signal on the access line 510. The access signal on the access line 505 may be compared with the reference signal on the access line 510 using the P-sense amp 515 and the N-sense amp 520, and a result of the comparison (e.g., a latching) may be output via the access line 505 and the access line 510, or via other access lines (e.g., input/output lines, not shown) coupled with the first and second nodes. Operations of the sense amplifier 500 may be based on one or more timing signals, with such operations including the coupling or isolation of the first and second nodes with a memory cell or reference signal source, the activation of the P-sense amp 515 or the N-sense amp 520, or the coupling of the first and second nodes with an input/output circuit, among other operations.

Figure 6:
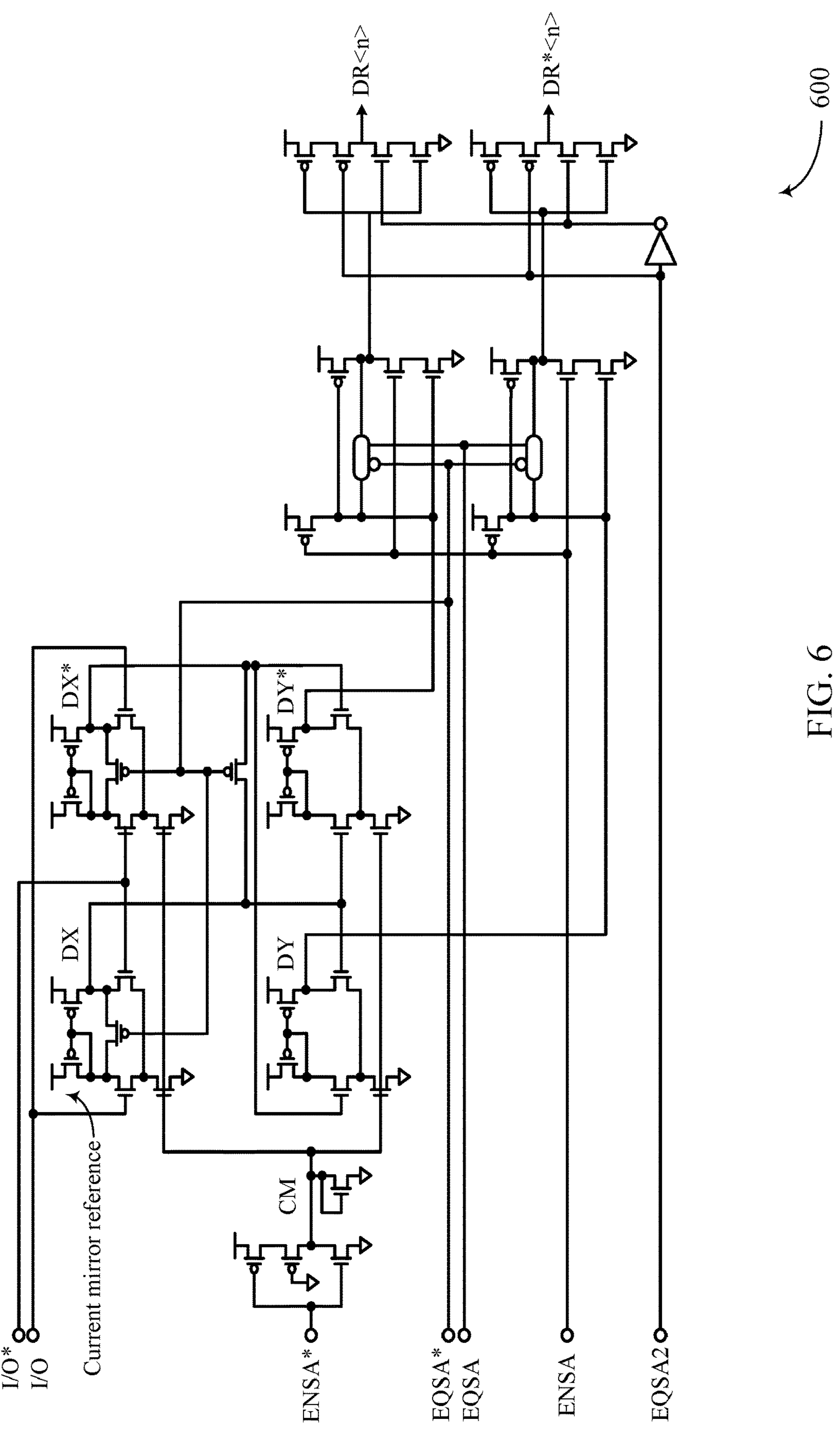
FIG. 6 illustrates an example of a data sense amplifier that supports data path signal amplification in coupled semiconductor systems in accordance with examples as disclosed herein.

FIG. 6 illustrates an example of a data sense amplifier (DSA) 600 that supports data path signal amplification in coupled semiconductor systems in accordance with examples as disclosed herein. The DSA 600 may be an example of amplification circuitry that may be implemented in write/sense circuitry 350 (e.g., DSA circuitry 385), and may be referred to as a DC sense amplifier (DCSA), a data amplifier, or a read amplifier, among other nomenclature. The DSA 600 may be coupled with a sense amplifier, such as a sense amplifier 500, along a data path. The DSA 600 may be an example of a second stage of signal amplification, which may be configured to output an amplified read signal (e.g., a second read signal) based on amplifying a read signal from the sense amplifier (e.g., a first stage of signal amplification). The DSA 600 may be an example of a high-speed, high-gain differential amplifier for amplifying relatively small read signals output from a sense amplifier 500, which may have relatively limited drive capability (e.g., relatively lower speed, relatively lower gain, or both).

The DSA 600 may include four differential pair amplifiers and self-biasing complementary metal-oxide semiconductor (CMOS) stages. The differential pairs may be configured as two sets of balanced amplifiers, which each may include an NMOS differential pair using PMOS active loads and NMOS current mirrors. In some examples, a first pair of amplifiers may be provided with I/O and I/O* signals from a sense amplifier 500 (e.g., latched read signals), and a second set of amplifiers may be provided with signals from the first pair, labeled DX and DX*. Outputs from the second stage, labeled DY and DY*, may be provided to self-biasing CMOS stages, which may support relatively fast operation. A final output stage may be capable of a tri-state operation, which may support multiple sets of DSAs 600 to drive a given set of data read lines (e.g., DR<n> and DR*<n>). In some implementations, the DSA 600 may be equilibrated prior to operation, including self-biasing CMOS inverter stages, by all of the devices connected to the signals labeled EQSA, EQSA*, and EQSA2, which may be based on clock signals associated with the operation of the DSA 600. In some examples, equilibration may support the DSA 600 being electrically balanced and properly biased before input signals are applied. The DSA 600 may be enabled when ENSA* is brought to a low state (e.g., based on clock signals associated with the operation of the DSA 600), which may turn on the output stage and the current mirror bias circuit, which is connected to the differential amplifiers labeled CM In accordance with the operations described herein, the DSA 600 may amplify relatively small received signals into full CMOS data signals. For example, read signals from a sense amplifier 500 or other first stage of signal amplification may be considered to be relatively analog signals (e.g., in accordance with a relatively slower or weaker signal transition from one state to another), and the amplified signals from a DSA 600 may be considered to be relatively digital signals (e.g., in accordance with a relatively faster or stronger signal transition from one state to another). Thus, a relatively high gain of a DSA 600, or other second stage of signal amplification, may mitigate a relatively low drive capability of a first stage of signal amplification by amplifying relatively small signals.

Figure 7:
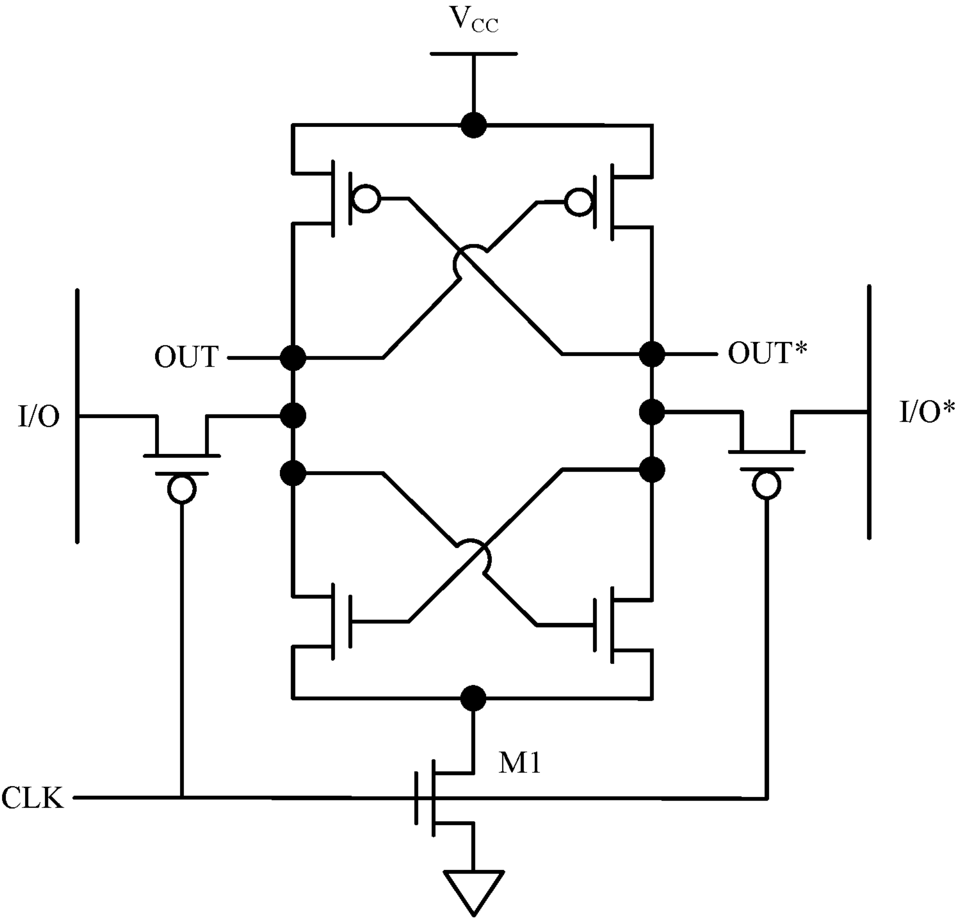
FIG. 7 illustrates an example of a helper flip-flop that supports data path signal amplification in coupled semiconductor systems in accordance with examples as disclosed herein.

FIG. 7 illustrates an example of a helper flip-flop (HFF) 700 that supports data path signal amplification in coupled semiconductor systems in accordance with examples as disclosed herein. The HFF 700 may be another example of signal amplification circuitry that may be implemented in write/sense circuitry 350 (e.g., as part of or as an alternative to DSA circuitry 385). The HFF 700 may be coupled with a sense amplifier, such as a sense amplifier 500, along a data path, and may be implemented as one or more instances along a given signal path of the data path (e.g., due to a relatively small area for implementing the HFF). For example, an HFF 700 may be used instead of a DSA 600 for a denser implementation of data path circuitry, or may be used before or after a DSA 600 for further amplification or maintenance of driven signals, among other implementations. The HFF 700 may be another example of a second stage of signal amplification, which may be configured to output an amplified read signal (e.g., a second read signal) based on amplifying a read signal from the sense amplifier (e.g., a first stage of signal amplification). The HFF 700 may be an example of a high-speed, high-gain differential amplifier for amplifying relatively small read signals output from a sense amplifier 500, which may have relatively limited drive capability (e.g., relatively lower speed, relatively lower gain, or both).

The HFF 700 may include a clocked connection of two inverters as a latch. For example, when a signal CLK (e.g., a clock signal associated with the operation of the HFF 700) is low, the I/O and I/O* lines may be connected to inputs/outputs of the inverters, and the inverters may not be coupled with a ground path because the transistor MI may be turned off (e.g., non-conductive, with an inactive channel) when CLK is low. When CLK transitions high, the outputs of the HFF 700 may amplify the input signals into full logic levels. Using positive feedback of the circuit elements may support relatively sensitive and fast operation (e.g., amplification) of the HFF 700.

Figure 8:
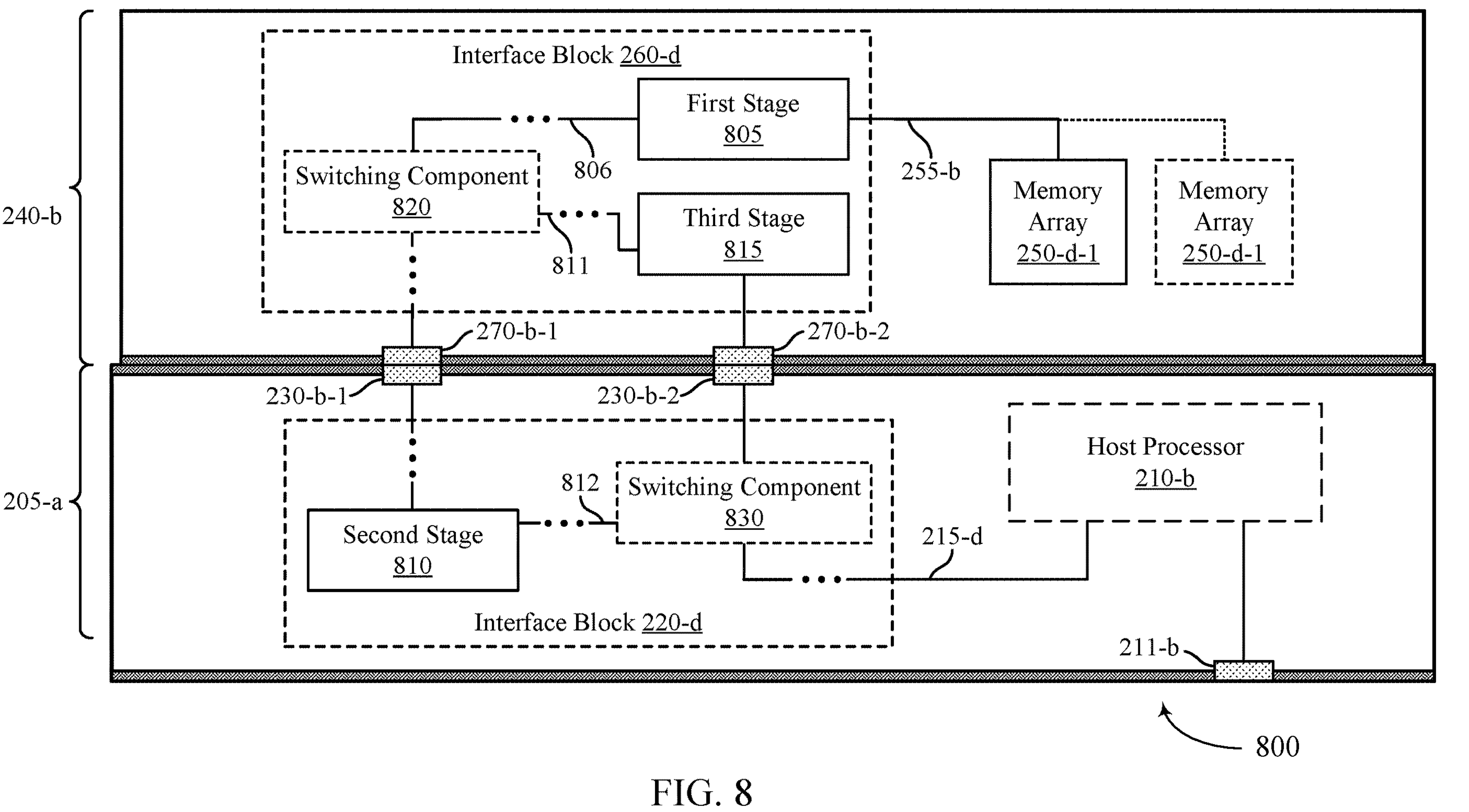
FIG. 8 illustrates an example of a system that supports data path signal amplification in coupled semiconductor systems in accordance with examples as disclosed herein.

FIG. 8 illustrates an example of a system 800 that supports data path signal amplification in coupled semiconductor systems in accordance with examples as disclosed herein. The system 800 illustrates an example of a die 205-*a* (e.g., a logic die) that is coupled with a die 240-*b* (e.g., a memory die). Although the illustrated example of a system 800 includes a singular die 240, a system 800 in accordance with the described techniques, may include any quantity of dies 240 coupled with a die 205.

The system 800 illustrates an example of a semiconductor system that supports switching between multiple data paths between memory arrays 250-*d* and a host interface 215. For example, a first data path, which may be implemented in accordance with aspects of the architecture 400, may include at least a first stage 805 (e.g., a first stage of signal amplification, included in an interface block 260-*d*) and a second stage 810 (e.g., a second stage of signal amplification, included in an interface block 220-*d*), and may involve signaling over a bus 255-*b*, a bus 806, and a bus 812. A second data path, which may be implemented in accordance with aspects of the architecture 300, may include at least the first stage 805 and a third stage 815 (e.g., a third stage of signal amplification, included in the interface block 260-*a*), and may involve signaling over the bus 255-*b*, the bus 806, and a bus 811. Each of the first data path and second data path may include other circuitry (e.g., of the interface block 260-*d*, of the interface block 220-*d*), not shown. In some examples, the interface block 260-*d* may include a FIFO/SERDES 340 between the third stage 815 and the contacts 270-*b*-2.

In some implementations, the first data path may be associated with a first data rate and the second data path may be associated with a second data rate that is different from (e.g., less than) the first data rate. In some examples, the first stage 805 may support a first clock rate, and the second stage 810, or the third stage 815, or both, may support a second clock rate that is different from (e.g., less than) the first clock rate. In some such examples, the first clock rate and the second clock rate may be based on respective clock signals at the die 240-*b* and the die 205-*a*. In some implementations, a clock signal at the die 240-*b* may be based on a clock signal from the die 205-*a* during a write operation, and a clock signal at the die 205-*a* may be based on a clock signal from the die 240-*b* during a read operation.

The first stage 805 may include sense amplifier circuitry 380, such as one or more sense amplifiers 500. The second stage 810 may include aspects of write/sense circuitry 350, such as DSA circuitry 385 (e.g., a DSA 600, an HFF 700, or both). The third stage 815 also may include aspects of write/sense circuitry 350, such as DSA circuitry 385 (e.g., a DSA 600, an HFF 700, or both). When implementing the first data path, voltages of one or more contacts 270-*b*-1 may be driven by the first stage 805 during read operations, and voltages of the one or more contacts 270-*b*-1 may be driven by the second stage 810 during write operations. When implementing the second data path, voltages of one or more contacts 270-*b*-2 may be driven by the third stage 815 during read operations, and voltages of the one or more contacts 270-*b*-2 may be driven by other circuitry of the interface block 220-*d* (e.g., logic drivers) during write operations.

The system 800 illustrates an example layout of switching components that may be operable to select between the first data path and the second data path. For example, the interface block 260-*d* may include a switching component 820 that is operable to couple the first stage 805 with either the one or more contacts 270-*b* (e.g., with the second stage 810) or with the third stage 815. Additionally, or alternatively, the interface block 220-*d* may include a switching component 830 that is operable to couple the host interface 215-*d* with either the one or more contacts 230-*b*-2 (e.g., with the third stage 815) or with the second stage 810.

In some implementations, the die 205-*a* and the die 240-*b* may support both fine-pitch interconnections and coarse-pitch interconnections. For example, the contacts 230-*b*-1 and 270-*b*-1 may be arranged and interconnected in accordance with a relatively fine pitch, and the contacts 230-*b*-2 and 270-*b*-2 may be arranged and interconnected in accordance with a relatively coarse pitch. A fine-pitch interconnection of contacts 270-*b*-1 and 230-*b*-1 may support a relatively high quantity of signal paths between the dies 205-*a* and 240-*b*, which may be implemented to support relatively high data rates. A coarse-pitch interconnection of contacts 270-*b*-2 and 230-*b*-2 may support relatively robust or reliable signal paths between the dies 205-*a* and 240-*b*, which be implemented to support diagnostic or backup functionality.

Operation of the switching component 820 or the switching component 830, or other configurations of switching components, may be initiated by various circuitry (e.g., controllers, logic) of the die 240-*b* (e.g., of the interface block 260-*d*), of the die 205-*a* (e.g., of the interface block 220-*d*), or of a host processor 210-*b* (e.g., of the die 205-*a*, external to the die 205-*a* via one or more contacts 211-*b*) to support various functionality of the system 800. In some examples, such switching components may be configured to switch between the first data path and the second data path based on conditions detected at the system 800, such as detected error conditions of the system 800. For example, such switching components may be operated to implement the first data path under normal operating conditions (e.g., nominal operating conditions), and to implement the second data path in response to detecting an error in circuitry of the first data path or an error in interconnections between contacts 270-*b*-1 and 230-*b*-1 or other signal paths of the first data path. Additionally, or alternatively, such switching components may be configured to switch between the first data path and the second data path based on an operating mode, such as implementing the first data path in a high-performance (e.g., high throughput) operating mode or implementing the second data path in a low-performance (e.g., low throughput, low-power) operating mode.

Thus, by enabling multiple data paths, the system 800 may support a first data path with relatively high throughput, and a second data path which may provide a backup or diagnostic function, enabling flexible operations and diagnostic techniques, among other advantages, compared with other techniques for configuring a semiconductor system.

Figure 9:
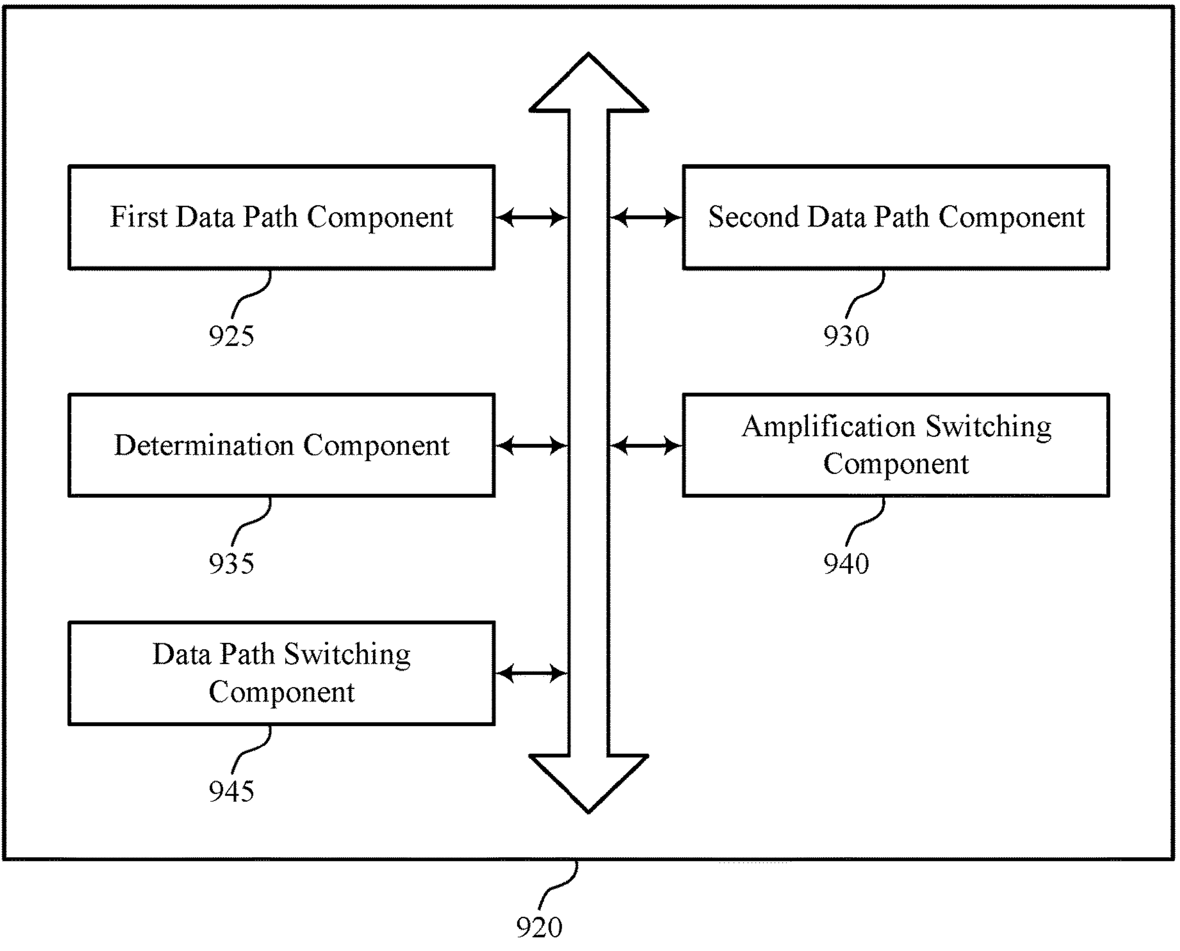
FIG. 9 illustrates a block diagram of a memory system that supports data path signal amplification in coupled semiconductor systems in accordance with examples as disclosed herein.

FIG. 9 illustrates a block diagram 900 of a memory system 920 that supports data path signal amplification in coupled semiconductor systems in accordance with examples as disclosed herein. The memory system 920 may be an example of aspects of a memory system as described with reference to FIGS. 1 through 8. The memory system 920, or various components thereof, may be an example of means for performing various aspects of data path signal amplification in coupled semiconductor systems as described herein. For example, the memory system 920 may include a first data path component 925, a second data path component 930, a determination component 935, an amplification switching component 940, a data path switching component 945, or any combination thereof. Each of these components may communicate, directly or indirectly, with one another (e.g., via one or more buses).

The first data path component 925 may be configured as or otherwise support a means for accessing a memory array of a first semiconductor die of a memory system during a first duration via a first data path between the memory array and a host interface of a second semiconductor die of the memory system coupled with the first semiconductor die, the first data path including a first stage of data path amplification circuitry at the first semiconductor die and a second stage of data path amplification circuitry at the second semiconductor die. In some examples, the second data path component 930 may be configured as or otherwise support a means for accessing the memory array during a second duration via a second data path between the memory array and the host interface, the second data path including the first stage of data path amplification circuitry at the first semiconductor die and a third stage of data path amplification circuitry at the first semiconductor die.

In some examples, the first stage of data path amplification circuitry includes one or more first amplifiers at the first semiconductor die, each first amplifier operable to output first read signals based on latching a difference between a reference signal and an access signal associated with coupling a memory cell of the memory array with the first amplifier. In some examples, the second stage of data path amplification circuitry includes one or more second amplifiers at the second semiconductor die, each second amplifier operable to couple with a first amplifier of the one or more first amplifiers and operable to output second read signals based on amplifying the first read signals from the coupled first amplifier. In some examples, the third stage of data path amplification circuitry includes one or more third amplifiers at the first semiconductor die, each first amplifier operable to couple with a first amplifier of the one or more first amplifiers and operable to output third read signals based on amplifying the first read signals from the coupled first amplifier.

In some examples, the amplification switching component 940 may be configured as or otherwise support a means for operating a switching component at the first semiconductor die or the second semiconductor die, the switching component operable to switch between coupling the first stage of data path amplification circuitry with the second stage of data path amplification circuitry or the third stage of data path amplification circuitry.

In some examples, the data path switching component 945 may be configured as or otherwise support a means for operating a switching component at the second semiconductor die, the switching component operable to switch between coupling the first data path with the host interface or coupling the second data path with the host interface.

In some examples, the determination component 935 may be configured as or otherwise support a means for determining whether to access the memory array via the first data path or the second data path based on an error condition of the memory system.

In some examples, the determination component 935 may be configured as or otherwise support a means for determining whether to access the memory array via the first data path or the second data path based on an operating a mode of the memory system.

FIG. 10 illustrates a flowchart showing a method 1000 that supports data path signal amplification in coupled semiconductor systems in accordance with examples as disclosed herein. The operations of method 1000 may be implemented by a memory system or its components as described herein. For example, the operations of method 1000 may be performed by a memory system as described with reference to FIGS. 1 through 9. In some examples, a memory system may execute a set of instructions to control the functional elements of the device to perform the described functions. Additionally, or alternatively, the memory system may perform aspects of the described functions using special-purpose hardware.

At 1005, the method may include accessing a memory array of a first semiconductor die of a memory system during a first duration via a first data path between the memory array and a host interface of a second semiconductor die of the memory system coupled with the first semiconductor die, the first data path including a first stage of data path amplification circuitry at the first semiconductor die and a second stage of data path amplification circuitry at the second semiconductor die. In some examples, aspects of the operations of 1005 may be performed by a first data path component 925 as described with reference to FIG. 9. For example, the memory system may include a first data path component 925 that operates one or more switching components (e.g., a switching component 820, a switching component 830) to implement the first data path (e.g., including a first stage 805 and a second stage 810), where aspects of the first data path component 925 may include or be operable based on logic (e.g., a determination component 935) of an interface block 260, of an interface block 220, or a host processor 210, or a combination thereof—e.g., as described herein, including with reference to FIGS. 8 and 9.

At 1010, the method may include accessing the memory array during a second duration via a second data path between the memory array and the host interface, the second data path including the first stage of data path amplification circuitry at the first semiconductor die and a third stage of data path amplification circuitry at the first semiconductor die. In some examples, aspects of the operations of 1010 may be performed by a second data path component 930 as described with reference to FIG. 9. For example, the memory system may include a second data path component 930 that operates one or more switching components (e.g., a switching component 820, a switching component 830) to implement the first data path (e.g., including a first stage 805 and a third stage 815), where aspects of the second data path component 930 may include or be operable based on logic (e.g., a determination component 935) of an interface block 260, of an interface block 220, or a host processor 210, or a combination thereof—e.g., as described herein, including with reference to FIGS. 8 and 9.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for accessing a memory array of a first semiconductor die of a memory system during a first duration via a first data path between the memory array and a host interface of a second semiconductor die of the memory system coupled with the first semiconductor die, the first data path including a first stage of data path amplification circuitry at the first semiconductor die and a second stage of data path amplification circuitry at the second semiconductor die and accessing the memory array during a second duration via a second data path between the memory array and the host interface, the second data path including the first stage of data path amplification circuitry at the first semiconductor die and a third stage of data path amplification circuitry at the first semiconductor die.

Aspect 2: The method, apparatus, or non-transitory computer-readable medium of aspect 1, where the first stage of data path amplification circuitry includes one or more first amplifiers at the first semiconductor die, each first amplifier operable to output first read signals based on latching a difference between a reference signal and an access signal associated with coupling a memory cell of the memory array with the first amplifier; the second stage of data path amplification circuitry includes one or more second amplifiers at the second semiconductor die, each second amplifier operable to couple with a first amplifier of the one or more first amplifiers and operable to output second read signals based on amplifying the first read signals from the coupled first amplifier; and the third stage of data path amplification circuitry includes one or more third amplifiers at the first semiconductor die, each first amplifier operable to couple with a first amplifier of the one or more first amplifiers and operable to output third read signals based on amplifying the first read signals from the coupled first amplifier.

Aspect 3: The method, apparatus, or non-transitory computer-readable medium of any of aspects 1 through 2, further including operations, features, circuitry, logic, means, or instructions, or any combination thereof for operating a switching component at the first semiconductor die or the second semiconductor die, the switching component operable to switch between coupling the first stage of data path amplification circuitry with the second stage of data path amplification circuitry or the third stage of data path amplification circuitry.

Aspect 4: The method, apparatus, or non-transitory computer-readable medium of any of aspects 1 through 3, further including operations, features, circuitry, logic, means, or instructions, or any combination thereof for operating a switching component at the second semiconductor die, the switching component operable to switch between coupling the first data path with the host interface or coupling the second data path with the host interface.

Aspect 5: The method, apparatus, or non-transitory computer-readable medium of any of aspects 1 through 4, further including operations, features, circuitry, logic, means, or instructions, or any combination thereof for determining whether to access the memory array via the first data path or the second data path based on an error condition of the memory system.

Aspect 6: The method, apparatus, or non-transitory computer-readable medium of any of aspects 1 through 5, further including operations, features, circuitry, logic, means, or instructions, or any combination thereof for determining whether to access the memory array via the first data path or the second data path based on an operating a mode of the memory system.

FIG. 11 illustrates a flowchart showing a method 1100 that supports data path signal amplification in coupled semiconductor systems in accordance with examples as disclosed herein. The operations of method 1100 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 1105, the method may include providing a first semiconductor component including a plurality of memory cells and a first portion of a data path between the plurality of memory cells and a host interface, the first portion of the data path including a first stage of data path amplification circuitry.

At 1110, the method may include providing a second semiconductor component including a second portion of the data path between the plurality of memory cells and the host interface, the second portion of the data path including a second stage of data path signal amplification circuitry.

At 1115, the method may include bonding the second semiconductor component with the first semiconductor component based on a fusion of a plurality of second conductive contacts of the second semiconductor component with a plurality of first conductive contacts of the first semiconductor component that electrically couples the second portion of the data path with the first portion of the data path.

In some examples, an apparatus (e.g., a manufacturing system) as described herein may perform a method or methods, such as the method 1100. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 7: A method or apparatus including operations, features, circuitry, logic, means, or instructions, or any combination thereof for providing a first semiconductor component including a plurality of memory cells and a first portion of a data path between the plurality of memory cells and a host interface, the first portion of the data path including a first stage of data path amplification circuitry; providing a second semiconductor component including a second portion of the data path between the plurality of memory cells and the host interface, the second portion of the data path including a second stage of data path signal amplification circuitry; and bonding the second semiconductor component with the first semiconductor component based on a fusion of a plurality of second conductive contacts of the second semiconductor component with a plurality of first conductive contacts of the first semiconductor component that electrically couples the second portion of the data path with the first portion of the data path.

Aspect 8: The method or apparatus of aspect 7, where the first stage of data path amplification circuitry includes one or more amplifiers, each amplifier operable to output a respective read signal based on latching a difference between a reference signal and an access signal associated with coupling a memory cell of the plurality of memory cells with the amplifier.

Aspect 9: The method or apparatus of any of aspects 7 through 8, where the second stage of data path amplification circuitry includes one or more second amplifiers, each second amplifier operable to couple with a respective amplifier of the one or more amplifiers and operable to output a respective second read signal based on amplifying the respective read signal from the respective amplifier.

Aspect 10: The method or apparatus of any of aspects 7 through 9, where the first semiconductor component includes a third stage of data amplification circuitry of a second data path between the plurality of memory cells and the host interface.

Aspect 11: The method or apparatus of any of aspects 7 through 10, where the first semiconductor component includes at least one first semiconductor die or at least one first semiconductor wafer and the second semiconductor component includes at least one second semiconductor die or at least one second semiconductor wafer.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 12: An apparatus, including: a first semiconductor die including a plurality of memory cells and a first portion of a data path between the plurality of memory cells and a host interface, the first portion of the data path including a first stage of data path amplification circuitry; and a second semiconductor die including a second portion of the data path between the plurality of memory cells and the host interface, the second portion of the data path including a second stage of data path signal amplification circuitry, where the second semiconductor die is coupled with the first semiconductor die based on a fusion of a plurality of second conductive contacts of the second semiconductor die with a plurality of first conductive contacts of the first semiconductor die that electrically couple the second portion of the data path with the first portion of the data path.

Aspect 13: The apparatus of aspect 12, where the first stage of data path amplification circuitry includes one or more amplifiers, each amplifier operable to output a respective read signal based on latching a difference between a reference signal and an access signal associated with coupling a memory cell of the plurality of memory cells with the amplifier.

Aspect 14: The apparatus of aspect 13, where the second stage of data path amplification circuitry includes one or more second amplifiers, each second amplifier operable to couple with a respective amplifier of the one or more amplifiers and operable to output a respective second read signal based on amplifying the respective read signal from the respective amplifier.

Aspect 15: The apparatus of any of aspects 12 through 14, where one or more voltages of the first conductive contacts during an operation to read from one or more of the plurality of memory cells are driven by the first stage of data path amplification circuitry.

Aspect 16: The apparatus of any of aspects 12 through 15, where one or more voltages of the first conductive contacts during an operation to write to one or more of the plurality of memory cells are driven by the second stage of data path amplification circuitry.

Aspect 17: The apparatus of any of aspects 12 through 16, where the first semiconductor die includes a third stage of data amplification circuitry of a second data path between the plurality of memory cells and the host interface.

Aspect 18: The apparatus of aspect 17, further including: a switching component of the first semiconductor die operable to couple the third stage of data amplification circuitry with the first stage of data amplification circuitry.

Aspect 19: The apparatus of any of aspects 17 through 18, where the data path is associated with a first data rate and the second data path is associated with a second data rate that is different from the first data rate.

Aspect 20: The apparatus of any of aspects 17 through 19, further including: a switching component of the second semiconductor operable to couple either the data path with the host interface or the second data path with the host interface.

Aspect 21: The apparatus of any of aspects 17 through 20, where the first stage of data amplification circuitry is associated with a first clock rate and the third stage of data amplification circuitry is associated with a second clock rate that is different from the first clock rate.

Aspect 22: The apparatus of any of aspects 17 through 21, further including: a serialization/deserialization component along the second data path.

Aspect 23: The apparatus of any of aspects 12 through 22, where: the first stage of data amplification circuitry is operable based on a first clock signal at the first semiconductor die; and the second stage of data amplification circuitry is operable based on a second clock signal at the second semiconductor die.

Aspect 24: The apparatus of aspect 23, where: the first clock signal is generated based on the second clock signal during a write operation; and the second clock signal is generated based on the first clock signal during a read operation.

Aspect 25: The apparatus of any of aspects 12 through 24, further including: a third semiconductor die including a second plurality of memory cells and a first portion of a third data path between the second plurality of memory cells and the host interface, the first portion of the third data path including the first stage of data path amplification circuitry, where: the second semiconductor die includes a second portion of the third data path between the second plurality of memory cells and the host interface, the second portion of the third data path including the second stage of data path signal amplification circuitry; and the third semiconductor die is coupled with the first semiconductor die based on a fusion of a plurality of third conductive contacts of the third semiconductor die with a plurality of fourth conductive contacts of the first semiconductor die that electrically couple the second portion of the third data path with the first portion of the third data path.

Aspect 26: The apparatus of any of aspects 12 through 25, where the second semiconductor die is coupled with the first semiconductor die based on a fusion of a second dielectric material at a surface of the second semiconductor die with a first dielectric material at a surface of the first semiconductor die.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:

a first semiconductor die comprising a plurality of memory cells and a first portion of a data path between the plurality of memory cells and a host interface, the first portion of the data path comprising a first stage of data path amplification circuitry; and a second semiconductor die comprising a second portion of the data path between the plurality of memory cells and the host interface, the second portion of the data path comprising a second stage of data path amplification circuitry, wherein the second semiconductor die is coupled with the first semiconductor die based on a fusion of a plurality of second conductive contacts of the second semiconductor die with a plurality of first conductive contacts of the first semiconductor die that electrically couple the second portion of the data path with the first portion of the data path.

2. The apparatus of claim 1, wherein the first stage of data path amplification circuitry comprises one or more amplifiers, each amplifier operable to output a respective read signal based on latching a difference between a reference signal and an access signal associated with coupling a memory cell of the plurality of memory cells with the amplifier.

3. The apparatus of claim 2, wherein the second stage of data path amplification circuitry comprises one or more second amplifiers, each second amplifier operable to couple with a respective amplifier of the one or more amplifiers and operable to output a respective second read signal based on amplifying the respective read signal from the respective amplifier.

4. The apparatus of claim 1, wherein one or more voltages of the plurality of first conductive contacts during an operation to read from one or more of the plurality of memory cells are driven by the first stage of data path amplification circuitry.

5. The apparatus of claim 1, wherein one or more voltages of the plurality of first conductive contacts during an operation to write to one or more of the plurality of memory cells are driven by the second stage of data path amplification circuitry.

6. The apparatus of claim 1, wherein the first semiconductor die comprises a third stage of data amplification circuitry of a second data path between the plurality of memory cells and the host interface.

7. The apparatus of claim 6, further comprising:
a switching component of the first semiconductor die operable to couple the third stage of data amplification circuitry with the first stage of data amplification circuitry.

8. The apparatus of claim 6, wherein the data path is associated with a first data rate and the second data path is associated with a second data rate that is different from the first data rate.

9. The apparatus of claim 6, further comprising:
a switching component of the second semiconductor die operable to couple either the data path with the host interface or the second data path with the host interface.

10. The apparatus of claim 6, wherein the first stage of data amplification circuitry is associated with a first clock rate and the third stage of data amplification circuitry is associated with a second clock rate that is different from the first clock rate.

11. The apparatus of claim 1, wherein:
the first stage of data amplification circuitry is operable based on a first clock signal at the first semiconductor die; and
the second stage of data amplification circuitry is operable based on a second clock signal at the second semiconductor die.

12. The apparatus of claim 11, wherein:
the first clock signal is generated based on the second clock signal during a write operation; and
the second clock signal is generated based on the first clock signal during a read operation.

13. The apparatus of claim 1, further comprising:
a third semiconductor die comprising a second plurality of memory cells and a first portion of a third data path between the second plurality of memory cells and the host interface, the first portion of the third data path comprising the first stage of data path amplification circuitry, wherein:
the second semiconductor die comprises a second portion of the third data path between the second plurality of memory cells and the host interface, the second portion of the third data path comprising the second stage of data path amplification circuitry; and
the third semiconductor die is coupled with the first semiconductor die based on a fusion of a plurality of third conductive contacts of the third semiconductor die with a plurality of fourth conductive contacts of the first semiconductor die that electrically couple the second portion of the third data path with the first portion of the third data path.

14. The apparatus of claim 1, wherein the second semiconductor die is coupled with the first semiconductor die based on a fusion of a second dielectric material at a surface of the second semiconductor die with a first dielectric material at a surface of the first semiconductor die.

15. A method, comprising:
accessing a memory array of a first semiconductor die of a memory system during a first duration via a first data path between the memory array and a host interface of a second semiconductor die of the memory system coupled with the first semiconductor die, the first data path comprising a first stage of data path amplification circuitry at the first semiconductor die and a second stage of data path amplification circuitry at the second semiconductor die; and
accessing the memory array during a second duration via a second data path between the memory array and the host interface, the second data path comprising the first stage of data path amplification circuitry at the first semiconductor die and a third stage of data path amplification circuitry at the first semiconductor die.

16. The method of claim 15, wherein:
the first stage of data path amplification circuitry comprises one or more first amplifiers at the first semiconductor die, each first amplifier operable to output first read signals based on latching a difference between a reference signal and an access signal associated with coupling a memory cell of the memory array with the first amplifier;
the second stage of data path amplification circuitry comprises one or more second amplifiers at the second semiconductor die, each second amplifier operable to couple with a first amplifier of the one or more first amplifiers and operable to output second read signals based on amplifying the first read signals from the coupled first amplifier; and
the third stage of data path amplification circuitry comprises one or more third amplifiers at the first semiconductor die, each third amplifier operable to couple with a first amplifier of the one or more first amplifiers and operable to output third read signals based on amplifying the first read signals from the coupled first amplifier.

17. The method of claim 15, further comprising:
operating a switching component at the first semiconductor die or the second semiconductor die, the switching component operable to switch between coupling the first stage of data path amplification circuitry with the second stage of data path amplification circuitry or the third stage of data path amplification circuitry.

18. The method of claim 15, further comprising:
operating a switching component at the second semiconductor die, the switching component operable to switch between coupling the first data path with the host interface or coupling the second data path with the host interface.

19. The method of claim 15, further comprising:
determining whether to access the memory array via the first data path or the second data path based on an error condition of the memory system or an operating a mode of the memory system.

20. A method, comprising:
providing a first semiconductor component comprising a plurality of memory cells and a first portion of a data path between the plurality of memory cells and a host interface, the first portion of the data path comprising a first stage of data path amplification circuitry;

providing a second semiconductor component comprising a second portion of the data path between the plurality of memory cells and the host interface, the second portion of the data path comprising a second stage of data path amplification circuitry; and bonding the second semiconductor component with the first semiconductor component based on a fusion of a plurality of second conductive contacts of the second semiconductor component with a plurality of first conductive contacts of the first semiconductor component that electrically couples the second portion of the data path with the first portion of the data path.

* * * * *